United States Patent
Le Bihan et al.

(10) Patent No.: US 10,401,457 B2
(45) Date of Patent: Sep. 3, 2019

(54) IMAGE PROCESSING APPARATUS, MAGNETIC RESONANCE IMAGING APPARATUS, IMAGE PROCESSING METHOD, AND STORAGE MEDIUM

(71) Applicant: Kyoto University, Kyoto (JP)

(72) Inventors: Denis Le Bihan, Kyoto (JP); Mami Iima, Kyoto (JP); Kojiro Yano, Kyoto (JP)

(73) Assignee: Kyoto University, Kyoto (JP)

( * ) Notice: Subject to any disclaimer, the term of this patent is extended or adjusted under 35 U.S.C. 154(b) by 263 days.

(21) Appl. No.: 15/122,601

(22) PCT Filed: Feb. 26, 2015

(86) PCT No.: PCT/JP2015/055638
§ 371 (c)(1),
(2) Date: Oct. 17, 2016

(87) PCT Pub. No.: WO2015/133363
PCT Pub. Date: Sep. 11, 2015

(65) Prior Publication Data
US 2017/0067978 A1    Mar. 9, 2017

(30) Foreign Application Priority Data

Mar. 5, 2014   (JP) ................ 2014-042340

(51) Int. Cl.
*G01R 33/563*   (2006.01)
*G01R 33/56*   (2006.01)
*G06T 7/00*   (2017.01)

(52) U.S. Cl.
CPC ... *G01R 33/56341* (2013.01); *G01R 33/5608* (2013.01); *G06T 7/0002* (2013.01);
(Continued)

(58) Field of Classification Search
None
See application file for complete search history.

(56) References Cited

U.S. PATENT DOCUMENTS

| | | | |
|---|---|---|---|
| 4,809,701 A | 3/1989 | Le Bihan et al. | |
| 6,567,684 B1 | 5/2003 | Chenevert et al. | |

(Continued)

FOREIGN PATENT DOCUMENTS

| | | |
|---|---|---|
| JP | 4-357934 | 12/1992 |
| JP | 6-54830 A | 3/1994 |
| JP | 5105786 B2 | 12/2012 |

OTHER PUBLICATIONS

Mehdi Moradi et al., "Multiparametric MRI maps for detection and grading of dominant prostate tumors", Journal of Magnetic Resonance Imaging, vol. 35, No. 6, pp. 1403-1413 (2012).

(Continued)

*Primary Examiner* — Jermele M Hollington
*Assistant Examiner* — Douglas X Rodriguez
(74) *Attorney, Agent, or Firm* — McDermott Will & Emery LLP

(57) ABSTRACT

Conventionally, it has been impossible to output an image that allows for an easy and accurate diagnosis as to whether or not a malignant tumor is present and that allows for correctly indicating a part with a high or low grade of malignancy in the tumor. With an image processing apparatus that includes: a receiving unit configured to receive diffusion weighted images; a parameter acquisition unit configured to acquire parameters of two or more types for each of one or more units of processing that constitute the diffusion weighted images, by using the diffusion weighted images; a diagnostic image composition unit configured to acquire, for each of the one or more units of processing, a score that corresponds to the parameters of two or more types, by using the parameters of two or more types, and to (Continued)

compose a diagnostic image that is an image having, for each of the one or more units of processing, a pixel value that corresponds to the acquired score that corresponds to the unit of processing; and an output unit configured to output the diagnostic image, it is possible to output an image that allows for an easy and accurate diagnosis as to whether or not a malignant tumor is present and that allows for correctly indicating a part with a high or low grade of malignancy in the tumor.

11 Claims, 26 Drawing Sheets

(52) U.S. Cl.
CPC .. *G06T 7/0012* (2013.01); *G06T 2207/10088* (2013.01); *G06T 2207/30004* (2013.01)

(56) References Cited

U.S. PATENT DOCUMENTS

| 7,701,210 | B2 | 4/2010 | Ichinose | |
|---|---|---|---|---|
| 2006/0142983 | A1* | 6/2006 | Sorensen | A61B 5/055 703/11 |

OTHER PUBLICATIONS

Grant Kinzya et al., "Functional and molecular imaging of localized and recurrent prostate cancer", European Journal of Nuclear Medicine and Molecular Imaging, Springer Verlag, Heidelberg, DE, vol. 40, No. 1, pp. 48-59 (2013).

Dow-Mu Koh et al., "Intravoxel Incoherent Motion in Body Diffusion-Weighted MRI: Reality and Challenges", America Journal of Poentgenology, vol. 196, No. 6, pp. 1351-1361 (2011).
Supplementary European Search Report issued in corresponding European Application No. 15759173.6, dated Nov. 15, 2017.
Notification of Reasons for Refusal issued in corresponding Japanese application No. 2014-042340, dated Nov. 7, 2017. (with English translation).
Tetsuya Wakayama et al., "Synthesized Diffusion Weighted Imaging in Liver: Comparison between conventional ADC and IVIM fitting models", Proc. Intl. Soc. Mag. Reson. Med., vol. 21, p. 4168 (2013).
Yonggang Lu et al., "Optical model mapping for characterizing tumor microcirculation with diffusion weighted imaging in head and neck cancer", Proc. Intl. Soc. Mag. Reson. Med., vol. 21, p. 3104 (2013).
Utaro Motosugi et al., "Diffusion-weighted MRI of the pancreas: Tips and topics", The Journal of Japan Pancreas Society, vol. 6, No. 1, pp. 72-78 (2011) with English language abstract on last page.
Derek K. Jones, Ph.D., "Diffusion MRI: Theory, Methods and Applications", Oxford University Press, (2010).
Denis Le Bihan et al., "Separation of Diffusion and Perfusion in Intravoxel Incoherent Motion MR Imaging", Radiology vol. 168, No. 2, pp. 497-505 (1988).
Jens H. Jensen et al., "MRI quantification of non-Gaussian water diffusion by kurtosis analysis", NMR Biomed., vol. 23, pp. 698-710 (2010).
Thoralf Niendorf et al., "Biexponential Diffusion Attenuation in Various States of Brain Tissue: Implications for Diffusion-Weighted Imaging", Magnetic Resonance in Medicine, vol. 36, pp. 847-857 (1996).
International Search Report issued in corresponding International Patent Application No. PCTJP2015/055638, dated May 12, 2015; 10 pages with English translation.

\* cited by examiner

| ID | TYPE | CONDITION | SCORE |
|---|---|---|---|
| . | . | . | . |
| . | . | . | . |
| . | . | . | . |
| 011 | ADC | ADC < 1.40 × 10^-3 | 1 |
| 012 | ADC | ADC ≧ 1.40 × 10^-3 | 0 |
| 013 | IVIM | IVIM > 2.07 | 1 |
| 014 | IVIM | IVIM ≦ 2.07 | 0 |
| 015 | Kurtosis | K > 0.8 | 1 |
| 016 | Kurtosis | K ≦ 0.8 | 0 |
| . | . | . | . |
| . | . | . | . |
| . | . | . | . |

FIG.7

| ID | CONDITION | DIAGNOSTIC RESULT |
|---|---|---|
| . | . | . |
| . | . | . |
| . | . | . |
| 011 | SCORE ≧ 3 | MALIGNANT (STAGE 3) |
| 012 | 2 ≦ SCORE < 3 | MALIGNANT (STAGE 2) |
| 013 | 1 ≦ SCORE < 2 | MALIGNANT (STAGE 1) |
| 014 | 0 ≦ SCORE < 1 | BENIGN |
| . | . | . |
| . | . | . |
| . | . | . |

FIG.8

| 0 | 0 | 0 | 0 | · | · | · | 0 | 0 | 0 | 0 |
|---|---|---|---|---|---|---|---|---|---|---|
| 0 | 0 | 1 | 1 | · | · | · | 1 | 1 | 0 | 0 |
| 0 | 1 | 1 | 1 | · | · | · | 1 | 1 | 1 | 0 |
| 0 | 1 | 1 | 1 | · | · | · | 1 | 1 | 1 | 0 |
| · | · | · | · |   |   |   | · | · | · | · |
| · | · | · | · | · | · | · | · | · | · | · |
| · | · | · | · |   |   |   | · | · | · | · |
| 0 | 1 | 1 | 1 | · | · | · | 1 | 1 | 1 | 0 |
| 0 | 1 | 1 | 1 | · | · | · | 1 | 1 | 1 | 0 |
| 0 | 0 | 1 | 1 | · | · | · | 1 | 1 | 0 | 0 |
| 0 | 0 | 0 | 0 | · | · | · | 0 | 0 | 0 | 0 |

FIG.13

| 0 | 0 | 0 | 1 | . | . | . | 1 | 0 | 0 | 0 |
|---|---|---|---|---|---|---|---|---|---|---|
| 0 | 0 | 0 | 1 | . | . | . | 1 | 0 | 0 | 0 |
| 0 | 0 | 1 | 1 | . | . | . | 1 | 1 | 0 | 0 |
| 1 | 1 | 1 | 1 | . | . | . | 1 | 1 | 1 | 1 |
| . | . | . | . |   |   |   | . | . | . | . |
| . | . | . | . |   | . . . |   | . | . | . | . |
| . | . | . | . |   |   |   | . | . | . | . |
| 1 | 1 | 1 | 1 | . | . | . | 1 | 1 | 1 | 1 |
| 0 | 0 | 1 | 1 | . | . | . | 1 | 1 | 0 | 0 |
| 0 | 0 | 0 | 1 | . | . | . | 1 | 0 | 0 | 0 |
| 0 | 0 | 0 | 1 | . | . | . | 1 | 0 | 0 | 0 |

FIG.14

| 0 | 0 | 0 | 0 | . | . | . | 0 | 0 | 0 | 0 |
|---|---|---|---|---|---|---|---|---|---|---|
| 0 | 0 | 0 | 1 | . | . | . | 1 | 0 | 0 | 0 |
| 1 | 1 | 1 | 1 | . | . | . | 1 | 1 | 1 | 1 |
| 1 | 1 | 1 | 1 | . | . | . | 1 | 1 | 1 | 1 |
| . | . | . | . |   |   |   | . | . | . | . |
| . | . | . | . | . | . | . | . | . | . | . |
| . | . | . | . |   |   |   | . | . | . | . |
| 1 | 1 | 1 | 1 | . | . | . | 1 | 1 | 1 | 1 |
| 1 | 1 | 1 | 1 | . | . | . | 1 | 1 | 1 | 1 |
| 0 | 0 | 0 | 1 | . | . | . | 1 | 0 | 0 | 0 |
| 0 | 0 | 0 | 0 | . | . | . | 0 | 0 | 0 | 0 |

| ID | TYPE | SCORE COEFFICIENT |
|---|---|---|
| . | . | . |
| . | . | . |
| . | . | . |
| 011 | ADC | 1.5 |
| 012 | IVIM | 1.0 |
| 013 | Kurtosis | 0.8 |
| . | . | . |
| . | . | . |
| . | . | . |

FIG.19

| 0.0 | 0.0 | 0.0 | 1.0 | ... | 1.0 | 0.0 | 0.0 | 0.0 |
|---|---|---|---|---|---|---|---|---|
| 0.0 | 0.0 | 1.5 | 3.3 | ... | 3.3 | 1.5 | 0.0 | 0.0 |
| 0.8 | 2.3 | 3.3 | 3.3 | ... | 3.3 | 3.3 | 2.3 | 0.8 |
| 1.8 | 3.3 | 3.3 | 3.3 | ... | 3.3 | 3.3 | 3.3 | 1.8 |
| ... | ... | ... | ... | ... | ... | ... | ... | ... |
| 1.8 | 3.3 | 3.3 | 3.3 | ... | 3.3 | 3.3 | 3.3 | 1.8 |
| 0.8 | 2.3 | 3.3 | 3.3 | ... | 3.3 | 3.3 | 2.3 | 0.8 |
| 0.0 | 0.0 | 1.5 | 3.3 | ... | 3.3 | 1.5 | 0.0 | 0.0 |
| 0.0 | 0.0 | 0.0 | 1.0 | ... | 1.0 | 0.0 | 0.0 | 0.0 |

FIG.20

| ID | TYPE | CONDITION | SCORE |
|---|---|---|---|
| ... | ... | ... | ... |
| 011 | ADC | $ADC < 1.40 \times 10^{-3}$ | 2 |
| 012 | ADC | $1.40 \times 10^{-3} \leq ADC < 1.8 \times 10^{-3}$ | 1 |
| 013 | ADC | $ADC \geq 1.8 \times 10^{-3}$ | 0 |
| 014 | IVIM | $IVIM > 2.07$ | 2 |
| 015 | IVIM | $1.05 < IVIM \leq 2.07$ | 1 |
| 016 | IVIM | $1.05 \geq IVIM$ | 0 |
| 017 | Kurtosis | $K > 0.8$ | 2 |
| 018 | Kurtosis | $0.5 < K \leq 0.8$ | 1 |
| 019 | Kurtosis | $0.5 \geq K$ | 0 |
| ... | ... | ... | ... |

FIG.21

IMAGE PROCESSING APPARATUS, MAGNETIC RESONANCE IMAGING APPARATUS, IMAGE PROCESSING METHOD, AND STORAGE MEDIUM

CROSS-REFERENCE TO RELATED APPLICATIONS

This Application is the U.S. National Phase under 35 U.S.C. § 371 of International Patent Application No. PCT/JP2015/055638 filed Sep. 11, 2015, which in turn claims the benefit and priority from Japanese Patent Application No. 2014-042340, filed on Mar. 5, 2014 the subject matters of which are incorporated by reference.

TECHNICAL FIELD

The present invention relates to an image processing apparatus and the like that processes a diffusion weighted image.

BACKGROUND ART

Conventionally, magnetic resonance imaging apparatuses and the like have been developed, by which a diffusion weighted image is generated and displayed such that regions of the diffusion weighted image that have a diffusion coefficient smaller than a threshold are distinguished from other regions (see Patent Document 1, for example).

CITATION LIST

Patent Documents

Patent Document 1: Japanese Patent No. 5105786
Patent Document 2: Specification of U.S. Pat. No. 4,809,701
Patent Document 3: Specification of U.S. Pat. No. 6,567,684
Patent Document 4: Specification of U.S. Pat. No. 7,701,210

Non-Patent Documents

Non-Patent Document 1: D. Jones, Diffusion MRI: Theory, Methods and Applications, Oxford University Press, 2011
Non-Patent Document 2: Le Bihan D, Breton E, Lallemand D, Aubin M L, Vignaud J, Laval-Jeantet M, Separation of diffusion and perfusion in intravoxel incoherent motion MR imaging, Radiology 168, 1998, p. 497-505
Non-Patent Document 3: Jensen J H, Helpern J A, MRI quantification of non-Gaussian water diffusion by kurtosis analysis, NMR in Biomedicine 23, 2010, p. 698-710
Non-Patent Document 4: Niendorf T, Dijkhuizen R M, Norris D G, van Lookeren Campagne M, Nicolay K, Biexponential diffusion attenuation in various states of brain tissue: Implications for diffusion-weighted imaging, Magnetic Resonance in Medicine 36, 1996, p. 847-857

SUMMARY OF INVENTION

Technical Problem

Conventional apparatuses or the like are unable to output an image that allows for an easy and accurate diagnosis as to whether or not a malignant tumor is present and that allows for correctly indicating a part with a high or low grade of malignancy in the tumor.

Also, regarding conventional apparatuses or the like, in order to carry out a diagnosis as to whether or not a malignant tumor is present, it has been proposed to implement a method for identifying a lesion site having an ADC value smaller than a threshold (see Patent Document 4, for example). However, this approach has several drawbacks. The first drawback is that only pixels that indicate an ADC value smaller than the threshold are taken into consideration. In this regard, using only the threshold of ADC values leads to false positive errors and false negative errors due to the ADC values of patients overlapping each other. The second drawback is that when putting this method into practice, ADC images that have been distinguished from each other based on the threshold are displayed by using a MIP method (a display method that projects regions having the maximum signal intensity on one image, out of all of the regions of the lesion). Therefore, all of the slices are projected onto one image. Consequently, although regions having a low ADC value are recognizable, correct information regarding the position of the lesion is lost.

Solution to Problem

An image processing apparatus according to one aspect of the present invention is an image processing apparatus that includes: a receiving unit configured to receive diffusion weighted images; a parameter acquisition unit configured to acquire parameters of two or more types for each of one or more units of processing that constitute the diffusion weighted images, by using the diffusion weighted images; a diagnostic image composition unit configured to acquire, for each of the one or more units of processing, a score that corresponds to the parameters of two or more types, by using the parameters of two or more types, and to compose a diagnostic image that is an image having, for each of the one or more units of processing, a pixel value that corresponds to the acquired score that corresponds to the unit of processing; and an output unit configured to output the diagnostic image.

With such a structure, it is possible to output an image that allows for an easy and accurate diagnosis as to whether or not a malignant tumor is present and that allows for correctly indicating a part with a high or low grade of malignancy in the tumor.

Advantageous Effects of Invention

With the image processing apparatus according to the aspect of the present invention, it is possible to output an image that allows for an easy and accurate diagnosis as to whether or not a malignant tumor is present and that allows for correctly indicating a part with a high or low grade of malignancy in the tumor.

BRIEF DESCRIPTION OF DRAWINGS

FIG. 7 is a diagram showing an example of score acquisition management information according to the same.

FIG. 8 is a diagram showing an example of diagnostic result management information according to the same.

FIG. 13 is a diagram showing examples of scores acquired for the ADC image according to the same.

FIG. 14 is a diagram showing examples of scores acquired for the IVIM image according to the same.

FIG. 15 is a diagram showing examples of scores acquired for the K image according to the same.

FIG. 16 is a diagram showing examples of totalled scores according to the same.

FIG. 19 is a diagram showing an example of score coefficient management information according to the same.

FIG. 20 is a diagram showing examples of totalled scores according to the same.

FIG. 21 is a diagram showing an example of score acquisition management information according to the same.

DESCRIPTION OF EMBODIMENTS

Figure 1:
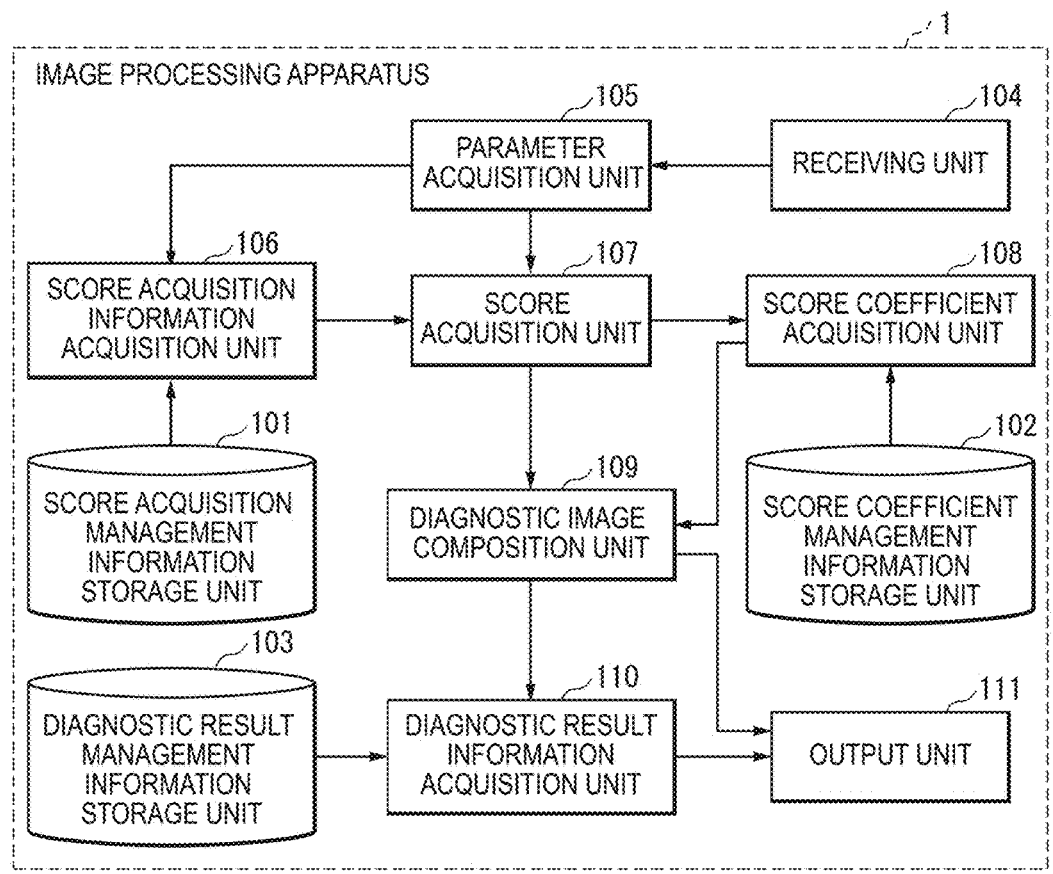
FIG. 1 is a block diagram for an image processing apparatus 1 according to Embodiment 1.

Hereinafter, embodiments of an image processing apparatus and the like according to the present invention will be described with reference to the drawings. Note that constituent elements denoted by the same reference numerals in the embodiment perform similar operations, and therefore a description thereof may not be repeated. Also, the format, the content, and the like of each kind of information described in the present embodiment are merely examples, and there is no limitation on the format, the content, and the like insofar as the meaning of the information can be represented.

Embodiment 1

In the present embodiment, a description will be given of an image processing apparatus 1 that: acquires parameters of two or more types from a diffusion weighted image; composes a diagnostic image by using the acquired parameters, the diagnostic image being an image used for carrying out a diagnosis as to whether or not a malignant tumor is present; and outputs the diagnostic image.

FIG. 1 is a block diagram showing the image processing apparatus 1 according to the present embodiment. The image processing apparatus 1 includes: a score acquisition management information storage unit 101; a score coefficient management information storage unit 102; a diagnostic result management information storage unit 103; a receiving unit 104; a parameter acquisition unit 105; a score acquisition information acquisition unit 106; a score acquisition unit 107; a score coefficient acquisition unit 108; a diagnostic image composition unit 109; a diagnostic result information acquisition unit 110; and an output unit 111.

One or more pieces of score acquisition management information are stored in the score acquisition management information storage unit 101. The score acquisition management information is information in which type information and score acquisition information are associated with each other.

The type information is information that indicates the types of parameters. The parameters are acquired by using diffusion weighted images. The type information is, in other words, information indicating the types of parameter maps. The type information is, in yet other words, information indicating the types of parameters that the parameter maps have.

A diffusion weighted image is an image obtained using a so-called MRI sequence, and is an image that is created based on a MR signal of an object. Generally, diffusion weighted images are also referred to as "DWIs". For the details of diffusion weighted images, see Non-Patent Document 1, for example.

Examples of the aforementioned parameters include an ADC value, an IVIM value, and a K value. The ADC value is a parameter that indicates a diffusion coefficient of water molecules within tissue. Usually, the ADC value is not an exact diffusion coefficient of water molecules within tissue, but is an approximated diffusion coefficient (apparent diffusion coefficient). The IVIM value is a parameter that indicates the flow of blood (perfusion) in capillary vessels in tissue. The K value is a parameter that indicates the kurtosis of displacement distribution of water molecules within tissue. See Non-Patent Documents 1 to 3, for example, for the details of the ADC value, the method and the procedures for calculating the ADC value, the details of the IVIM value, the method and the procedures for calculating the IVIM value, the details of the K value, and the method and the procedures for calculating the K value. The aforementioned parameters may be other than the ADC value, the IVIM value, or the K value, for example. See Non-Patent Document 4, for example, for the details of parameters other than the ADC value, the IVIM value, or the K value, and the methods and the procedures for calculating the parameters.

A parameter map is information that has one or more parameters of one type. A parameter map only needs to have one or more parameters of one type, and there is no limitation on the data structure, the data format, and the like. Parameter maps may be, for example, a one-dimensional array. Parameter maps may be, for example, a two-dimensional array. Parameter maps may be, for example, so-called images (hereinafter referred to as "parameter images" as appropriate).

A parameter image is an image that is composed by using one or more parameters of one type. In other words, a parameter image is an image generated from one or more parameters of one type. The "image generated from parameters" is, for example; an image having the parameters as pixel values; an image having values that have been obtained using the parameters, as pixel values; or an image having values that have been determined for the classes of the parameters in advance, as pixel values. The pixel values may be so-called color values (RGB values), or so-called luminance values. A parameter image is an image having one or more parameters of one type. Usually, the one or more parameters of one type are respectively associated with the one or more pixels that the parameter image has.

Note that an ADC value is hereinafter denoted as "ADC" as appropriate. An IVIM value is hereinafter denoted as "IVIM" as appropriate. A K value is hereinafter denoted as "Kurtosis" as appropriate. A parameter map that has an ADC value is hereinafter denoted as "an ADC map" as appropriate. Generally, an ADC map is also referred to as "an ADC image". A parameter map that has an IVIM value is hereinafter denoted as "an IVIM map" as appropriate. Generally, an IVIM map is also referred to as "an IVIM image". A parameter map that has a K value is hereinafter denoted as "a K map" as appropriate. Generally, a K map is also referred to as "a K image".

The type information indicates, for example, "ADC", "IVIM", or "K". "ADC" indicates, for example, that the parameter map is an ADC map, the type of the parameter that the parameter map has is the ADC value, and so on. "IVIM" indicates, for example, that the parameter map is an IVIM map, the type of the parameter that the parameter map has is the IVIM value, and so on. "K" indicates, for example, that the parameter map is a K map, the type of the parameter that the parameter map has is the K value, and so on.

The score acquisition information is information used for acquiring scores corresponding to parameters. Usually, the score acquisition information is one or more conditions regarding parameters (hereinafter denoted as "parameter conditions" as appropriate). The score acquisition information may be, for example, formulas for calculating scores (hereinafter denoted as "score calculation formulas" as appropriate). Usually score calculation formulas have a variable to which a parameter is to be assigned. The score calculation formulas may be, for example, so-called functions or programs. The score acquisition information may be, for example, a table showing the correspondence between parameters and scores (hereinafter denoted as "score correspondence table" as appropriate). Usually, the score correspondence table has one or more pairs consisting of a parameter and a score.

If the score acquisition information is one or more parameter conditions, the one or more parameter conditions each usually have one or more thresholds. If the number of parameter conditions is two or more, the number of parameter conditions and the number of thresholds usually satisfy the following relationship: "the number of parameter conditions−1=the number of thresholds".

For example, if the score acquisition management information has two parameter conditions, the two parameter conditions usually have one threshold. If the one threshold is "TH", the two parameter conditions are, for example, "param<TH" and "param≥TH".

If the score acquisition management information has three parameter conditions, for example, the three parameter conditions usually have one or two thresholds out of two or more thresholds. If the two thresholds are "TH1" and "TH2", the three parameter conditions are, for example, "param<TH1", "TH1≤param<TH2", and "param≥TH2".

If the score acquisition management information has four or more parameter conditions, for example, the four or more parameter conditions usually have one or two thresholds out of three or more thresholds. If the three or more thresholds are "TH1", "TH2", "TH3", ..., and "THm", the four or more parameter conditions are, for example, "param<TH1", "TH1≤param<TH2", "TH2≤param<TH3", "TH3≤param<TH4", ..., and "param≥THm".

Note that the parameter conditions may be associated with scores, for example. The scores are for using the parameters that the parameter maps have, as scores.

Two or more pieces of score coefficient management information are stored in the score coefficient management information storage unit 102. The score coefficient management information is information in which type information and score coefficients that are weights that are to be assigned to scores are associated with each other. A score coefficient is, for example, a real number, an integer, or the like.

One or more pieces of diagnostic result management information are stored in the diagnostic result management information storage unit 103. The diagnostic result management information is information in which a score condition that is a condition regarding a score, and diagnostic result information that is information indicating a diagnostic result corresponding to the score, are associated with each other. The diagnostic result information is information indicating, for example, whether a tumor is malignant or benign, the grade of malignancy if the tumor is malignant, and the like.

The receiving unit 104 receives a diffusion weighted image. "Receiving" is a concept that includes the acquisition of information input from an input device such as a touch panel or a keyboard, the acquisition of information stored in a storage medium such as an optical disc, a magnetic disk, or a semiconductor memory, the reception of information transmitted from a wired or wireless communication network, and the like.

Usually the receiving unit 104 receives one set of diffusion weighted images. The one set of diffusion weighted images are images consisting of one set of two or more diffusion weighted images having different b-values that include the information of a gradient magnetic field. In other words, the one set of diffusion weighted images are images that consist of two or more diffusion weighted images having different b-values. For example, if one set of diffusion weighted images consists of two diffusion weighted images, the two diffusion weighted images usually consist of a so-called low b-value diffusion weighted image and a so-called high b-value diffusion weighted image. The two or more diffusion weighted images constituting the one set of diffusion weighted images are diffusion weighted images of the same image-captured position. The image-captured position is an image-captured position of an image-captured target.

The receiving unit 104 may receive, for example, two or more diffusion weighted images that have different b-values. If this is the case, the two or more diffusion weighted images are diffusion weighted images that can serve as the above-described one set of diffusion weighted images. In other words, the two or more diffusion weighted images are diffusion weighted images of the same image-captured position.

The receiving unit 104 may receive, for example, two or more sets of diffusion weighted images of different image-captured positions.

Image-captured positions are the positions of so-called slices. Image-captured positions may also be referred to as "image-captured regions" or "image-captured locations", for example. Usually, the two or more sets of diffusion weighted images are captured images of the same object. Usually, diffusion weighted images received by the receiving unit 104 are two-dimensional images.

The receiving unit 104 may receive, for example, interest region information. The interest region information is information indicating a region within a diffusion weighted image. In other words, the interest region information is information indicating a region for which the user wishes to carry out a diagnosis. The interest region information is, for example, a collection of one or more coordinates within a diffusion weighted image, an image used for masking the region of interest, or the like.

The receiving unit 104 may receive, for example, parameter maps of two or more types. If this is the case, each of the parameter maps is usually associated with the type information indicating the type of the parameter map.

The input part for inputting information, instructions, and the like to the receiving unit 104 may be realized in any manner, such as by using a menu screen or a keyboard. The receiving unit 104 may be realized using software for controlling the menu screen, a device driver for the input part such as a keyboard, or the like.

The parameter acquisition unit 105 acquires parameters of two or more types. The parameter acquisition unit 105 usually acquires the parameters of two or more types as parameter maps of two or more types that have one or more parameters of one type out of the parameters of two or more types. That is to say, the parameter acquisition unit 105 usually acquires parameter maps of two or more types. Usually, the types of parameter maps that the parameter acquisition unit 105 acquires have been determined in advance.

The parameters are evaluated by using a perfusion/diffusion model. Examples of appropriate models available for analyzing parameters of two or more types include a Kurtosis model, a Biexponenital model, and an IVIM model. Regarding these models, see Non-Patent Documents 2 to 4, for example.

For example, if the receiving unit 104 receives a diffusion weighted image, the parameter acquisition unit 105 acquires parameter maps of two or more types that correspond to the diffusion weighted images, by using the diffusion weighted images. Specifically, using the diffusion weighted images, the parameter acquisition unit 105 acquires parameters of two or more types for each of one or more units of processing that constitute the diffusion weighted images. The units of processing are units for each of which parameters of two or more types are to be acquired. Usually, each unit of processing is a region composed of one or more pixels. That is to say, each unit of processing is, for example, a region consisting of one pixel, a region consisting of two adjacent pixels, a region consisting of four adjacent pixels, or the like. A region consisting of one pixel is one pixel. Usually, the units of processing have been determined in advance. The parameter acquisition unit 105 holds information indicating the units of processing in advance. The parameter acquisition unit 105 acquires parameters for each unit of processing indicated by the information.

For example, the parameter acquisition unit 105 acquires parameters of two or more types for one pixel that is included in the diffusion weighted images, by using the one pixel. Alternatively, for example, the parameter acquisition unit 105 acquires parameters of two or more types for one pixel that is included in the diffusion weighted images, by using the one pixel and two adjacent pixels that are located on the top and the bottom of the one pixel (three pixels in total). Alternatively, for example, the parameter acquisition unit 105 acquires parameters of two or more types for one pixel that is included in the diffusion weighted images, by using the one pixel and two adjacent pixels that are located on the left and the right of the one pixel (three pixels in total). Alternatively, for example, the parameter acquisition unit 105 acquires parameters of two or more types for one pixel that is included in the diffusion weighted images, by using the one pixel and four adjacent pixels that are located on the top, the bottom, the left, and the right of the one pixel (five pixels in total).

The parameter acquisition unit 105 then acquires parameter maps of two or more types that each have, for each of one or more units of processing, parameters of one type out of the acquired parameters of two or more types.

The parameter acquisition unit 105 acquires, for example, with respect to one diffusion weighted image, parameters of two or more types for each of one or more pixels that are included in the diffusion weighted image. That is to say, the number of pixels included in one diffusion weighted image and the number of parameters that a parameter map of one type has are usually the same. In other words, the number of units of processing that are included in one diffusion weighted image and the number of parameters that a parameter map of one type has are usually the same. The one or more pixels that are included in one diffusion weighted image and the one or more parameters that a parameter map of one type has are usually associated with each other in one-to-one correspondence. In other words, the units of processing that are included in one diffusion weighted image and the parameters that a parameter map of one type has are usually associated with each other in one-to-one correspondence.

Alternatively, for example, if the receiving unit 104 receives one or more sets of diffusion weighted images, the parameter acquisition unit 105 acquires, for each diffusion weighted image out of the one or more sets of diffusion weighted images, parameter maps of two or more types that correspond to the diffusion weighted image.

The parameter acquisition unit 105 associates, with the acquired parameter maps, type information that indicates the types of the acquired parameter maps, for example. The type information is usually held by the parameter acquisition unit 105. Alternatively, the type information may be stored in a predetermined storage region, for example.

If the receiving unit 104 receives parameter maps of two or more types, for example, the parameter acquisition unit 105 acquires the parameter maps of two or more types. Each of the parameter maps of two or more types is usually associated with type information.

The parameter acquisition unit 105 may compose parameter images of two or more types that correspond to a diffusion weighted image, for example. If this is the case, for example, using the diffusion weighted image received by the receiving unit 104, the parameter acquisition unit 105 acquires parameters of two or more types for each of one or more units of processing that constitute the diffusion weighted image. The parameter acquisition unit 105 composes a parameter image that is an image having, for each of one or more units of processing, a pixel value that corresponds to a parameter of one type out of the acquired parameters of two or more types. "A pixel value that corresponds to a parameter" is, for example, the parameter per se, a value calculated using the parameter, or a value that has been determined for the class of the parameter in advance.

The method and the procedures for acquiring parameters of two or more types by using diffusion weighted images, the method and the procedures for acquiring a parameter map having the acquired parameters, the method and the procedures for composing a parameter image having the acquired parameters, and the like are well known, and therefore a detailed description thereof is omitted. The parameter acquisition unit 105 calculates parameters by using calculation formulas for calculating the parameters, for example. The calculation formulas have variables to which one or more pixel values are to be assigned, for example.

If the receiving unit 104 receives region-of-interest information, the parameter acquisition unit 105 acquires parameter maps of two or more types that correspond to the region indicated by the region-of-interest information. For example, if the receiving unit 104 receives a diffusion weighted image, the parameter acquisition unit 105 usually cuts out, from the diffusion weighted image, an image corresponding to the region indicated by the region-of-interest information. The parameter acquisition unit 105 then composes parameter maps of two or more types that correspond to the cut-out image, by using the cut-out image. If the receiving unit 104 receives parameter maps of two or more types, for example, the parameter acquisition unit 105 acquires, from the parameter maps of two or more types, information that corresponds to the region indicated by the region-of-interest information, as the parameter maps of two or more types.

Preferably, the parameter maps of two or more types that are acquired by the parameter acquisition unit 105 are, for example, parameter maps of two or more types out of parameter maps of three or more types that include an ADC map, an IVIM map, and a K map.

The score acquisition information acquisition unit 106 acquires score acquisition information that corresponds to type information, from score acquisition management information. The type information is type information that is associated with the parameter maps acquired by the parameter acquisition unit 105. The type information is hereinafter denoted as "acquired type information" as appropriate. The score acquisition management information is score acquisition management information stored in the score acquisition management information storage unit 101.

Specifically, the score acquisition information acquisition unit 106 judges which piece out of two or more pieces of score acquisition management information has the type information that is the same as the acquired type information. The score acquisition information acquisition unit 106 then acquires one or more parameter conditions from the score acquisition management information that has been judged as having the type information that is the same as the acquired type information.

The parameter acquisition unit 105 usually acquires parameter maps of two or more types. Therefore, the score acquisition information acquisition unit 106 acquires, for each of the parameter maps of two or more types, score acquisition information that corresponds to the type information that is associated with the parameter map, from the score acquisition management information. Alternatively, the score acquisition information acquisition unit 106 may acquire score acquisition management information having the type information that is the same as the acquired type information, for example.

The score acquisition unit 107 acquires, for each of one or more units of processing, scores that correspond to the parameter maps of two or more types, by using: the parameters that the parameter maps of two or more types have for each of one or more units of processing; and the score acquisition information. That is to say, the score acquisition unit 107 acquires, for each of the parameter maps of two or more types, one or more scores that correspond to the parameter map. The score acquisition unit 107 usually acquires one score for one or more parameters that a parameter map of one type has.

For example, first, with respect to the parameter map for which a score is to be acquired, the score acquisition unit 107 acquires type information that is associated with the parameter map. The score acquisition unit 107 then acquires the score acquisition information that the type information is associated with, from the score acquisition information acquired by the score acquisition information acquisition unit 106. The score acquisition unit 107 then acquires, by using the acquired score acquisition information and the parameter map for which a score is to be acquired, one or more scores that correspond to the parameter map.

For example, it is assumed that the score acquisition information acquisition unit 106 acquires one parameter condition for a parameter map for which a score is to be acquired. If this is the case, the score acquisition unit 107 judges, for each of one or more parameters, whether or not the parameter satisfies the parameter condition. If the parameter condition is satisfied, the score acquisition unit 107 acquires a predetermined score as a score that corresponds to the parameter. If the parameter condition is not satisfied, the score acquisition unit 107 acquires a predetermined score as a score that corresponds to the parameter. Note that the predetermined scores are usually held by the score acquisition unit 107 in advance. Alternatively, the predetermined scores may be stored in a predetermined storage region, for example.

Alternatively, for example, it is assumed that the score acquisition information acquisition unit 106 acquires two parameter conditions for a parameter map for which a score is to be acquired. If this is the case, the score acquisition unit 107 judges, for each of one or more parameters, which parameter condition out of the two parameter conditions is satisfied by the parameter. The score acquisition unit 107 then acquires a score that is associated with the parameter condition that is satisfied by the parameter, as a score corresponding to the parameter.

Alternatively, for example, it is assumed that the score acquisition information acquisition unit 106 acquires three or more parameter conditions for a parameter map for which a score is to be acquired. If this is the case, the score acquisition unit 107 judges, for each of one or more parameters, which parameter condition out of the three or more parameter conditions is satisfied by the parameter. The score acquisition unit 107 then acquires a score that is associated with the parameter condition that is satisfied by the parameter, as a score corresponding to the parameter.

Alternatively for example, it is assumed that the score acquisition information acquisition unit 106 acquires a score calculation formula for a parameter map for which a score is to be acquired. If this is the case, for each of one or more parameters, the score acquisition unit 107 substitutes the parameter into the score calculation formula, calculates the score calculation formula after the substitution of the parameter, and calculates a score that corresponds to the parameter.

Alternatively, for example, it is assumed that the score acquisition information acquisition unit 106 acquires a score correspondence table for a parameter map for which a score is to be acquired. If this is the case, the score acquisition unit 107 acquires, for each of one or more parameters, a score that corresponds to the parameter from the score correspondence table.

The score coefficient acquisition unit 108 acquires a score coefficient that corresponds to type information from the score coefficient management information. The type information is type information that is associated with the parameter maps acquired by the parameter acquisition unit 105. The score coefficient management information is score coefficient management information that is stored in the score coefficient management information storage unit 102. Specifically the score coefficient acquisition unit 108 acquires a score coefficient that is associated with type information that is the same as the acquired type information, from the score coefficient management information.

The diagnostic image composition unit 109 composes a diagnostic image. The diagnostic image is an image used for carrying out a diagnosis as to whether or not a tumor is present. The diagnostic image is, in other words, an image that allows for diagnosis as to whether or not a tumor is present, for example. The diagnostic image is, in yet other words, an image that is used for diagnosis as to the grade of malignancy of a tumor, for example. The diagnostic image is, in yet other words, an image that allows for diagnosis as to the grade of malignancy of a tumor, for example. Generally, the diagnostic image is also referred to as "the diagnostic map".

Usually, using two or more scores for each of one or more units of processing (hereinafter denoted as "sub scores" as appropriate) that correspond to the parameter maps of two or more types, the diagnostic image composition unit 109 acquires a score (hereinafter denoted as "a diagnostic score" as appropriate) that corresponds to the sub scores. The diagnostic image composition unit 109 then composes a diagnostic image that is an image having, for each of the one or more units of processing, a pixel value that corresponds to the acquired diagnostic score of the unit of processing. "A pixel value that corresponds to a diagnostic score" is, for example, the diagnostic score per se, a value calculated using the diagnostic score, or a value that has been determined for the diagnostic score in advance.

For example, the diagnostic image composition unit 109 classifies one or more sub scores that correspond to parameter maps of two or more types into one or more groups for each unit of processing. Usually one or more sub scores that correspond to parameter maps of two or more types, namely two or more sub scores in total, are classified into the one or more groups. The diagnostic image composition unit 109 then acquires, for each of the classified groups, a diagnostic score that corresponds to two or more sub scores that the group has.

For example, it is assumed that the parameter maps acquired by the parameter acquisition unit 105 are an ADC map and a K map. It is also assumed that the two or more sub scores have been classified for each pixel. In such a case, for example, the diagnostic image composition unit 109 classifies two sub scores that correspond to coordinates (1,1) in the diffusion weighted image (the score corresponding to the ADC value that the ADC map has, and the score corresponding to the K value that the K map has) into one group.

Usually, the diagnostic image composition unit 109 calculates a diagnostic score by totaling the two or more sub scores that have been classified into one group. The diagnostic image composition unit 109 holds, for example, a calculation formula for calculating a diagnostic score (hereinafter denoted as "the diagnostic score calculation formula" as appropriate) in advance. Usually, the diagnostic score calculation formula has variables to which two or more sub scores are to be assigned. The diagnostic score calculation formula may be, for example, a so-called function or a program. The diagnostic image composition unit 109 may calculate the diagnostic score by substituting two or more sub scores that have been classified into one group, into the diagnostic score calculation formula. Alternatively, the diagnostic image composition unit 109 holds, for example, a correspondence table showing the correspondence between two or more sub scores and one diagnostic score (hereinafter denoted as "the diagnostic score correspondence table" as appropriate), in advance. The diagnostic image composition unit 109 may acquire a diagnostic score that corresponds to the two or more parameters that have been classified into one group, from the diagnostic score correspondence table.

If the receiving unit 104 receives two or more sets of diffusion weighted images, the diagnostic image composition unit 109 composes, respectively for the two or more sets of diffusion weighted images, two or more diagnostic images that correspond to the two or more sets of diffusion weighted images. The diagnostic image composition unit 109 may compose a three-dimensional diagnostic image by compositing the two or more diagnostic images. Note that the method and the procedures for composing a three-dimensional image (a three-dimensional diagnostic image in this case) by compositing two or more two-dimensional images (two-dimensional diagnostic images in this case) are well known, and therefore a description thereof is omitted.

In the case of totaling two or more sub scores, for example, the diagnostic image composition unit 109 may total the sub scores by using a score coefficient, for example. The score coefficient is a score coefficient acquired by the score coefficient acquisition unit 108. If this is the case, the diagnostic image composition unit 109 multiplies, by a score coefficient that corresponds to the type of a parameter map, a sub score corresponding to a parameter map of the type. For example, it is assumed that the parameter maps acquired by the parameter acquisition unit 105 are an ADC map and a K map. In such a case, the diagnostic image composition unit 109 multiplies, for example, the sub score corresponding to the ADC map by a score coefficient corresponding to the ADC map. Also, the diagnostic image composition unit 109 multiplies, for example, the sub score corresponding to the K map by a score coefficient corresponding to the K map. The diagnostic image composition unit 109 then calculates the diagnostic score by totaling the two sub scores that have been multiplied by the score coefficients.

The diagnostic image composition unit 109 may compose a diagnostic image by using parameter maps of two or more types, for example. If this is the case, the diagnostic image composition unit 109 holds, for example, a diagnostic score calculation formula in advance. The diagnostic score calculation formula has, for example, variables to which parameters of two or more types are to be assigned. The diagnostic image composition unit 109 then calculates the diagnostic score by substituting the parameters of two or more types for each of the predetermined units of processing into the diagnostic score calculation formula. Alternatively, the diagnostic image composition unit 109 holds, for example, a diagnostic score correspondence table in advance. The diagnostic score correspondence table is a table showing the correspondence between parameters of two or more types and one diagnostic score. The diagnostic image composition unit 109 then acquires a diagnostic score that corresponds to the parameters of two or more types for each of the predetermined units of processing, from the diagnostic score correspondence table.

Usually, it is preferable that the diagnostic image composed by the diagnostic image composition unit 109 is a color image. However, the diagnostic image may be a so-called grayscale image, for example.

The diagnostic result information acquisition unit 110 acquires one or more pieces of diagnostic result information that correspond to the diagnostic image, from the diagnostic result management information. The diagnostic image is a diagnostic image composed by the diagnostic image composition unit 109. The diagnostic result management information is the diagnostic result management information that is stored in the diagnostic result management information storage unit 103.

Usually, the diagnostic result information acquisition unit 110 acquires, for each of one or more units of processing that constitute a diagnostic image, diagnostic result information corresponding to the score condition that is satisfied by the score corresponding to the unit of processing, from the diagnostic result management information. Examples of the units of processing here include a region that is composed of one or more pixels to which the same score is associated. That is to say, for example, the diagnostic result information acquisition unit 110 acquires, for each of the one or more pixels that the diagnostic image has, the diagnostic result information corresponding to the score condition that is satisfied by the score corresponding to the pixel. Alternatively, for example, the diagnostic result information acquisition unit 110 acquires, for each region that is composed of one or more pixels that the diagnostic image has and to which the same score is associated, the diagnostic result information corresponding to the score condition that is satisfied by the score corresponding to the pixel.

If the diagnostic image composition unit 109 has acquired two or more diagnostic images, the diagnostic result information acquisition unit 110 acquires, for each of the two or more diagnostic images, one or more pieces of diagnostic result information, for example. That is to say, the diagnostic result information acquisition unit 110 usually acquires one or more pieces of diagnostic result information for one diagnostic image.

Alternatively, the diagnostic result information acquisition unit 110 may acquire, for each of one or more pixels that the diagnostic image has, diagnostic result information that corresponds to the score that is associated with the pixel, for example. Alternatively, the diagnostic result information acquisition unit 110 may acquire diagnostic result information for a pixel that is associated with a score that is sufficiently high to satisfy a predetermined condition, out of one or more pixels that the diagnostic image has, for example.

The output unit 111 outputs the diagnostic image. The diagnostic image is a diagnostic image composed by the diagnostic image composition unit 109. "Output" is a concept that includes display on a display apparatus, projection using a projector, printing using a printer, the output of sound, transmission to an external apparatus, accumulation in a storage medium, and the handover of processing results to another processing apparatus or another program. Regarding transmission, accumulation, and the handover of processing results, it is assumed that the output target is ultimately presented to the user.

If the diagnostic result information acquisition unit 110 acquires one or more pieces of diagnostic result information, the output unit 111 may output both the diagnostic image and the one or more pieces of diagnostic result information, for example. If this is the case, the output unit 111 usually outputs the diagnostic image and the one or more pieces of diagnostic result information such that it is possible to discern the correspondence between the regions in the diagnostic image and the one or more pieces of diagnostic result information. For example, the output unit 111 outputs the diagnostic image and the diagnostic result information such that the diagnostic result information is overlaid on the diagnostic image. Alternatively, for example, the output unit 111 outputs the diagnostic image and a table showing the correspondence between the colors in the diagnostic image and the diagnostic result information.

The output unit 111 may or may not include an output device such as a display or a speaker. The output unit 111 may be realized using driver software for an output device, or driver software for an output device and the output device.

Although it is preferable that the score acquisition management information storage unit 101, the score coefficient management information storage unit 102, and the diagnostic result management information storage unit 103 are realized using non-volatile storage media, they may be realized using volatile storage media. There is no limitation on the process of storing predetermined information in the score acquisition management information storage unit 101 and so on. For example, the predetermined information may be stored in the score acquisition management information storage unit 101 or the like via a recording medium, a communication network, an input device, or the like.

The parameter acquisition unit 105, the score acquisition information acquisition unit 106, the score acquisition unit 107, the score coefficient acquisition unit 108, the diagnostic image composition unit 109, and the diagnostic result information acquisition unit 110 are usually realized using an MPU, a memory, and so on. Usually, the processing procedures performed by the parameter acquisition unit 105 and so on are realized using software, and the software is stored in a recording medium such as a ROM. The parameter acquisition unit 105 and so on may be realized using hardware (dedicated circuitry).

Figure 2:
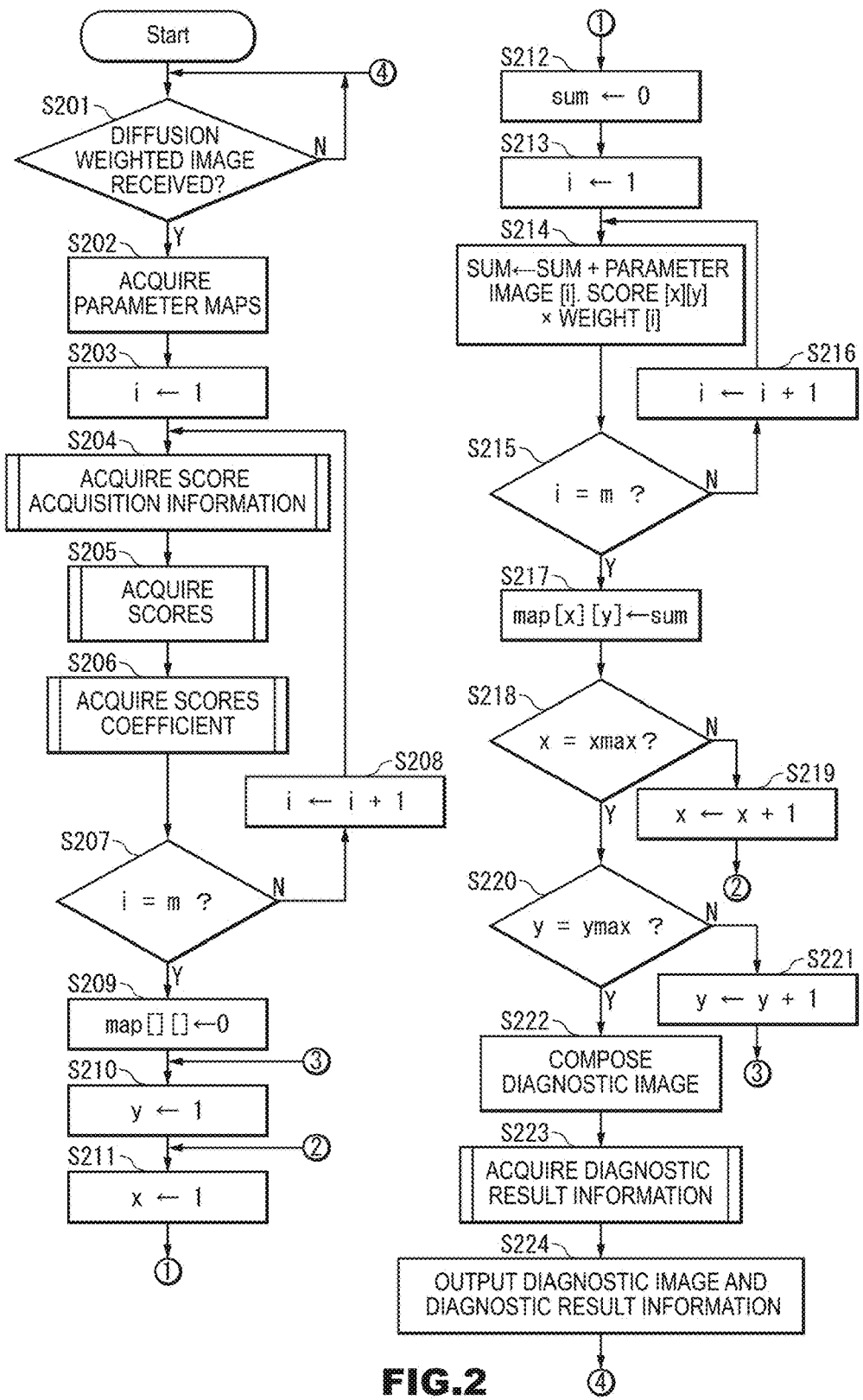
FIG. 2 is a flowchart illustrating overall operations of the image processing apparatus 1 according to the same.

Next, the overall operations of the image processing apparatus 1 will be described with reference to a flowchart. Note that the $i^{th}$ piece of given information will be denoted as "information [i]". FIG. 2 is a flowchart showing the overall operations of the image processing apparatus 1.

Step S201: The parameter acquisition unit 105 judges whether or not the receiving unit 104 has received one diffusion weighted image. If the receiving unit 104 has received one diffusion weighted image, step S202 is performed next. Otherwise, step S201 is performed again.

Step S202: Using the diffusion weighted image received in step S201, the parameter acquisition unit 105 acquires parameter maps of two or more types that have been determined in advance. Here, it is assumed that the parameter acquisition unit 105 acquires parameter maps of m types (m≥2). It is also assumed that the parameter maps are two-dimensional arrays having one or more parameters respectively corresponding to one or more pixels that the diffusion weighted image has.

Step S203: The diagnostic image composition unit 109 sets 1 to a counter i.

Step S204: The score acquisition information acquisition unit 106 acquires one or more pieces of score acquisition information that correspond to the parameter map [i]. The details of this processing will be described with reference to the flowchart shown in FIG. 3.

Step S205: Using the score acquisition information acquired in step S204, the score acquisition unit 107 acquires one or more scores that correspond to the parameter map [i]. The details of this processing will be described with reference to the flowchart shown in FIG. 4.

Step S206: The score coefficient acquisition unit 108 acquires a score coefficient corresponding to the type of the parameter map [i]. The details of this processing will be described with reference to the flowchart shown in FIG. 5.

Step S207: The diagnostic image composition unit 109 judges whether or not i is equal to m. If i is equal to m, step S209 is performed next. Otherwise, step S208 is performed next.

Step S208: The diagnostic image composition unit 109 increments i by 1. Then, processing returns to step S204.

Step S209: the diagnostic image composition unit 109 sets 0 to an array map [ ][ ] in which the scores corresponding to the one or more pixels of the diagnostic image are stored (i.e. initializes the array map [ ][ ]).

Step S210: The diagnostic image composition unit 109 sets 1 to a counter y. Here, y is a variable that indicates the coordinate in the y direction (the y coordinate) of the parameter map, and it is assumed that the size of the parameter map in the y direction (the vertical length) is denoted as ymax.

Step S211: The diagnostic image composition unit 109 sets 1 to a counter x. Here, x is a variable that indicates the coordinate in the x direction (the x coordinate) of the parameter map, and it is assumed that the size of the parameter map in the x direction (the horizontal length) is denoted as xmax.

Step S212: The diagnostic image composition unit 109 sets 0 to a variable "sum".

Step S213: The diagnostic image composition unit 109 sets 1 to the counter i.

Step S214: The diagnostic image composition unit 109 multiplies a score [x][y], which is the score corresponding to the pixel at the coordinates (x,y) of the parameter map [i], by a weight [i], which is the coefficient corresponding to the type of the parameter map [i] and the coefficient acquired in step S206, and adds the result to sum.

Step S215: The diagnostic image composition unit 109 judges whether or not i is equal to m. If i is equal to m, step S217 is performed next. Otherwise, step S216 is performed next.

Step S216: The diagnostic image composition unit 109 increments i by 1. Then, processing returns to step S214.

Step S217: The diagnostic image composition unit 109 sets sum to a map [x][y].

Step S218: The diagnostic image composition unit 109 judges whether or not x is equal to xmax. If x is equal to xmax, step S219 is performed next. Otherwise, step S220 is performed next.

Step S219: The diagnostic image composition unit 109 increments x by 1. Then, processing returns to step S212.

Step S220: The diagnostic image composition unit 109 judges whether or not y is equal to ymax. If y is equal to ymax, step S222 is performed next. Otherwise, step S221 is performed next.

Step S221: The diagnostic image composition unit 109 increments y by 1. Then, processing returns to step S211.

Step S222: The diagnostic image composition unit 109 generates an image from the map [ ][ ], and thus composes a diagnostic image.

Step S223: The diagnostic result information acquisition unit 110 acquires one or more pieces of diagnostic result information that correspond to the diagnostic image acquired in step S222. The details of this processing will be described with reference to the flowchart shown in FIG. 6.

Step S224: The output unit 111 outputs the diagnostic image composed in step S222 and the one or more pieces of diagnostic result information acquired in step S223. Then, processing returns to step S201.

Note that, in the flowchart shown in FIG. 2, processing may be ended due to a power OFF or an interruption that ends processing.

Figure 3:
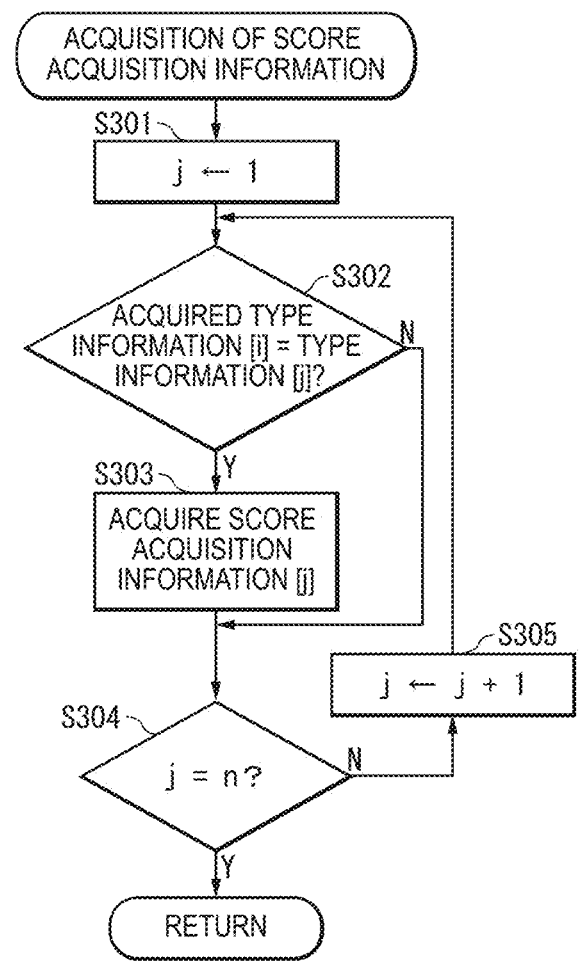
FIG. 3 is a flowchart illustrating parameter condition acquisition processing according to the same.

FIG. 3 is a flowchart showing the processing performed in step S204 in the flowchart shown in FIG. 2 to acquire the score acquisition information. In the flowchart shown in FIG. 3, it is assumed that n pieces of score acquisition management information are stored in the score acquisition management information storage unit 101.

Step S301: The score acquisition information acquisition unit 106 sets 1 to a counter j.

Step S302: The score acquisition information acquisition unit 106 judges whether or not the acquired type information [i], which is the type information associated with the parameter map [i] in the flowchart shown in FIG. 2, is the same as the type information [j], which is the type information that the score acquisition management information [j] has. If the acquired type information [i] is the same as the type information [j], step S303 is performed next. Otherwise, step S304 is performed next.

Step S303: The score acquisition information acquisition unit 106 acquires score acquisition information [j], which is the score acquisition information that the score acquisition management information [j] has.

Step S304: The score acquisition information acquisition unit 106 judges whether or not j is equal to n. If j is equal to n, the processing returns to the higher-level processing. Otherwise, step S305 is performed next.

Step S305: The score acquisition information acquisition unit 106 increments j by 1. Then, processing returns to step S302.

Figure 4:
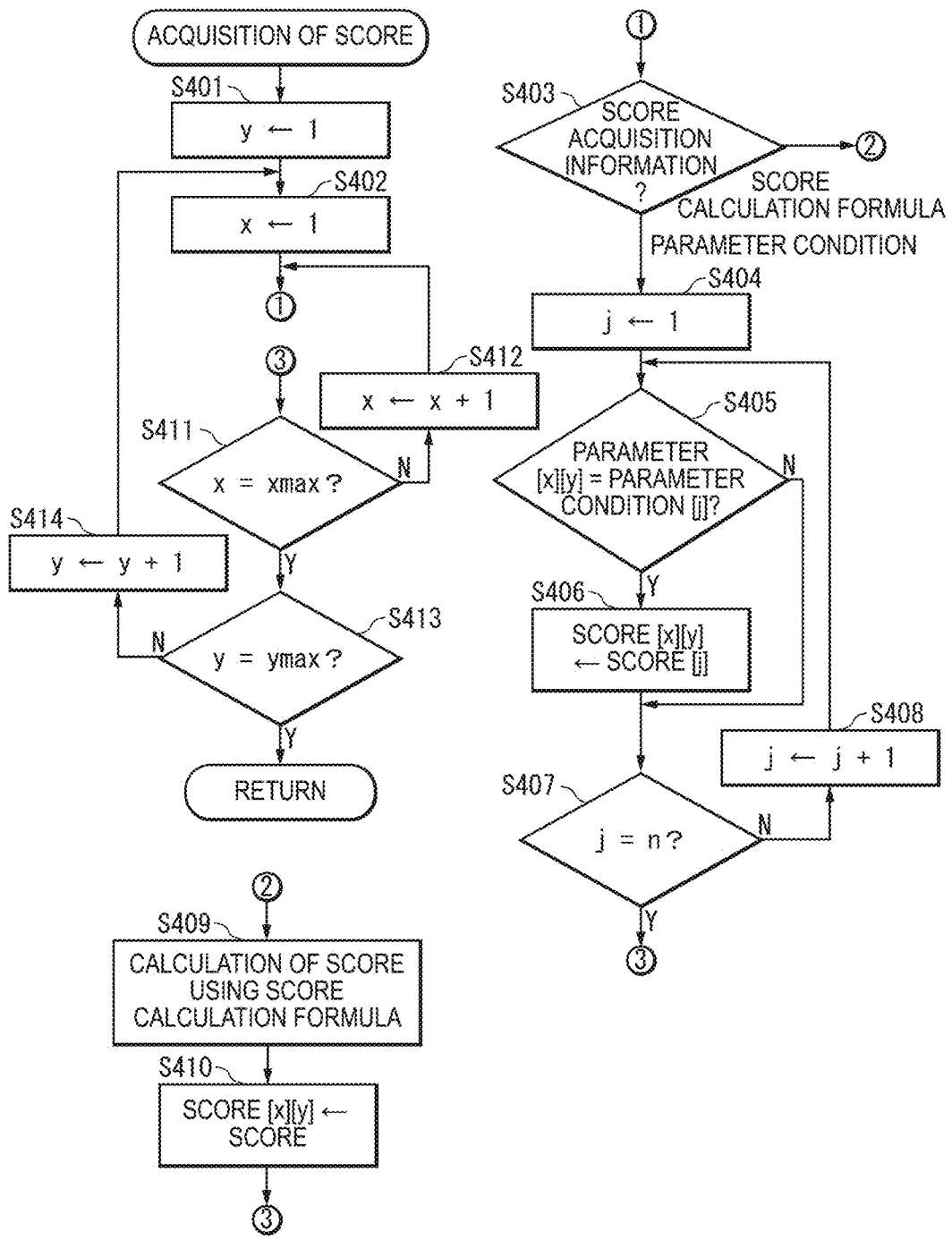
FIG. 4 is a flowchart illustrating score acquisition processing according to the same.

FIG. 4 is a flowchart showing the score acquisition processing performed in step S205 in the flowchart shown in FIG. 2. In the flowchart shown in FIG. 4, it is assumed that the score acquisition information acquisition unit 106 has acquired n pieces of score acquisition information for each of the parameter maps of two or more types. It is also assumed that the score acquisition information consists of two or more parameter conditions or score calculation formulas.

Step S401: The score acquisition unit 107 sets 1 to the counter y.

Step S402: The score acquisition unit 107 sets 1 to the counter x.

Step S403: The score acquisition unit 107 judges whether the score acquisition information acquired in the flowchart shown in FIG. 3 is a parameter condition or a score calculation formula. If the score acquisition information is a parameter condition, step S404 is performed next. Otherwise, step S409 is performed next.

Step S404: The score acquisition unit 107 sets 1 to the counter j.

Step S405: The score acquisition unit 107 judges whether or not the parameter [x][y], which is the parameter corresponding to the coordinates (x, y) of the parameter map [i] in the flowchart shown in FIG. 2, satisfies the parameter condition [j], which denotes the two or more parameter conditions corresponding to the parameter map [i] and the parameter conditions acquired in the flowchart shown in FIG. 3. If the parameter [x][y] satisfies the parameter condition [j], step S406 is performed next. Otherwise, step S407 is performed next.

Step S406: The score acquisition unit 107 sets a score [j], which is the score associated with the parameter condition [j], to the array score [x][y], in which the score corresponding to the parameter at the coordinates (x,y) of the parameter map [i] is stored.

Step S407: The score acquisition unit 107 judges whether or not j is equal to n. If j is equal to n, step S411 is performed next. Otherwise, step S408 is performed next.

Step S408: The score acquisition unit 107 increments j by 1. Then, processing returns to step S405.

Step S409: The score calculation unit 107 calculates a score by substituting the parameter corresponding to the coordinates (x,y) of the parameter map [i] in the flowchart shown in FIG. 2, into the score calculation formula acquired in the flowchart shown in FIG. 3.

Step S410: The score acquisition unit 107 sets the score acquired in step S409 to the array score [x][y], in which the score corresponding to the parameter at the coordinates (x,y) of the parameter map [i] is stored.

Step S411: The score acquisition unit 107 judges whether or not x is equal to xmax. If x is equal to xmax, step S413 is performed next. Otherwise, step S412 is performed next.

Step S412: The score acquisition unit 107 increments x by 1. Then, processing returns to step S403.

Step S413: The score acquisition unit 107 judges whether or not y is equal to ymax. If y is equal to ymax, the processing returns to the higher-level processing. Otherwise, step S414 is performed next.

Step S414: The score acquisition unit 107 increments y by 1. Then, processing returns to step S402.

Figure 5:
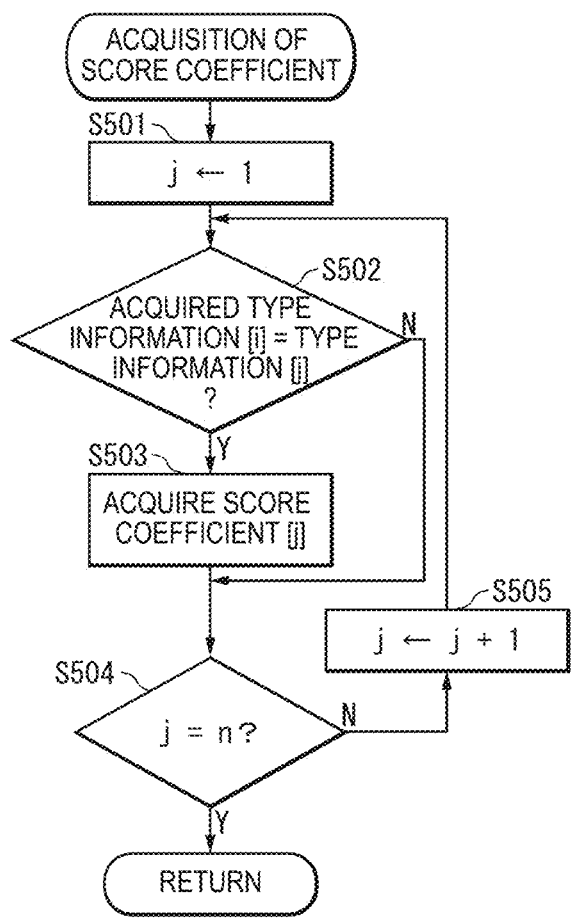
FIG. 5 is a flowchart illustrating score coefficient acquisition processing according to the same.

FIG. 5 is a flowchart showing the score coefficient acquisition processing performed in step S206 in the flowchart shown in FIG. 2. In the flowchart shown in FIG. 5, it is assumed that n pieces of score coefficient management information are stored in the score coefficient management information storage unit 102.

Step S501: The score coefficient acquisition unit 108 sets 1 to the counter j.

Step S502: The score coefficient acquisition unit 108 judges whether or not the acquired type information [i], which is the type information associated with the parameter map [i] in the flowchart shown in FIG. 2, is the same as the type information [j], which is the type information that the score coefficient management information [j] has. If the acquired type information [i] is the same as the type information [j], step S503 is performed next. Otherwise, step S504 is performed next.

Step S503: The score coefficient acquisition unit 108 acquires the score coefficient [j], which is the score coefficient that the score coefficient management information [j] has.

Step S504: The score coefficient acquisition unit 108 judges whether or not j is equal to n. If j is equal to n, the processing returns to the higher-level processing. Otherwise, step S505 is performed next.

Step S505: The score coefficient acquisition unit 108 increments j by 1. Then, processing returns to step S502.

Figure 6:
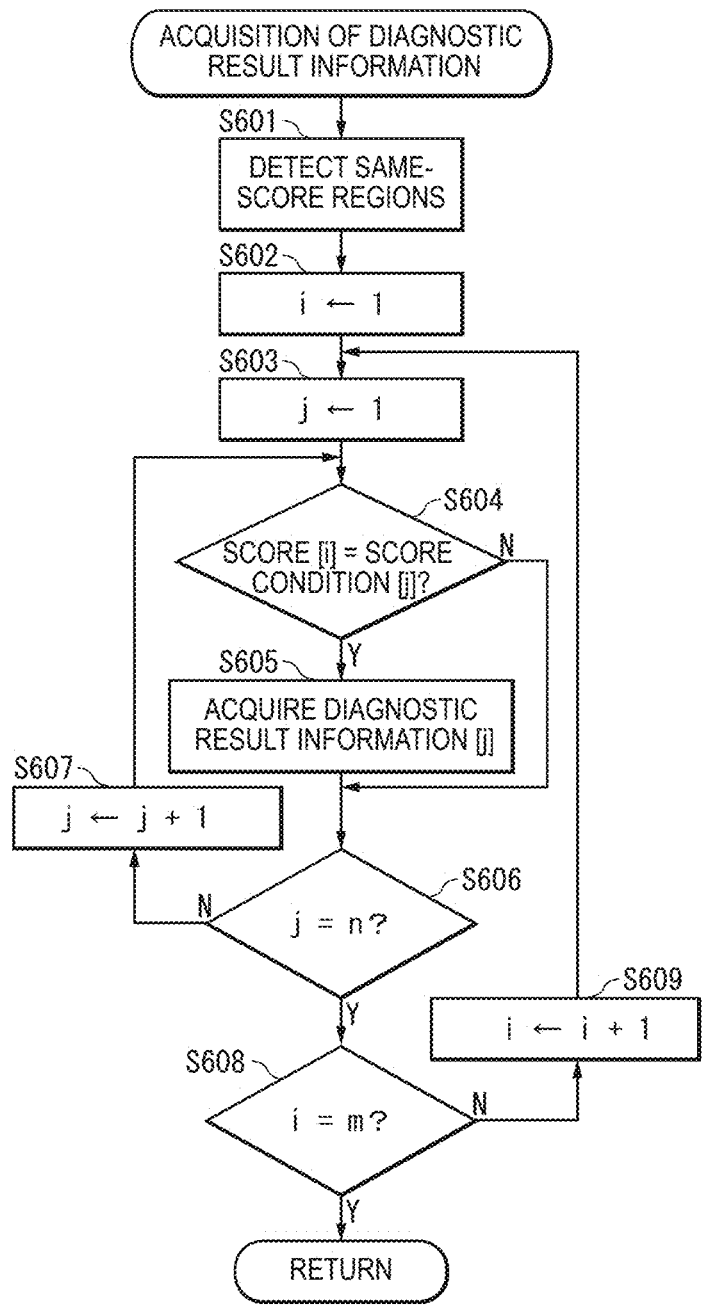
FIG. 6 is a flowchart illustrating diagnostic result information acquisition processing according to the same.

FIG. 6 is a flowchart showing the diagnostic result information acquisition processing performed in step S223 in the flowchart shown in FIG. 2. In the flowchart shown in FIG. 6, it is assumed that n pieces of diagnostic result management information are stored in the diagnostic result management information storage unit 103.

Step S601: The diagnostic result information acquisition unit 110 detects, from the diagnostic image, one or more same-score regions that are regions composed of one or more pixels that correspond to the same score. Here, it is assumed that the diagnostic result information acquisition unit 110 detects m same-score regions.

Step S602: The diagnostic result information acquisition unit 110 sets 1 to the counter i.

Step S603: The diagnostic result information acquisition unit 110 sets 1 to the counter j.

Step S604: The diagnostic result information acquisition unit 110 judges whether or not the score [i], which is the score corresponding to the same-score region [i], satisfies the score condition [j], which is the score condition that the diagnostic result management information [j] has. If the score [i] satisfies the score condition [j], step S605 is performed next. Otherwise, step S606 is performed next.

Step S605: The diagnostic result information acquisition unit 110 acquires the diagnostic result information [j], which is the diagnostic result information that the diagnostic result management information [j] has, as the diagnostic result information corresponding to the same-score regions [i].

Step S606: The diagnostic result information acquisition unit 110 judges whether or not j is equal to n. If j is equal to n, step S608 is performed next. Otherwise, step S607 is performed next.

Step S607: The diagnostic result information acquisition unit 110 increments j by 1. Then, processing returns to step S604.

Step S608: The diagnostic result information acquisition unit 110 judges whether or not i is equal to m. If i is equal to m, the processing returns to the higher-level processing. Otherwise, step S609 is performed next.

Step S609: The diagnostic result information acquisition unit 110 increments i by 1. Then, processing returns to step S603.

Note that the above-described overall operations of the image processing apparatus 1 are merely an example. That is to say, the overall operations of the image processing apparatus 1 are not limited to the description above.

Specific Example

Next, a specific example of the operations of the image processing apparatus 1 will be described. In the present specific example, it is assumed that the score acquisition management information shown in FIG. 7 is stored in the score acquisition management information storage unit 101. The score acquisition management information includes: IDs for uniquely specifying records; pieces of type information (item name: TYPE); parameter conditions (item name: CONDITION); and scores. In the score acquisition management information, the same pieces of type information are associated with two parameter conditions, and the two parameter conditions are each associated with a score. The parameter conditions associated with scores are score acquisition information. Also, the diagnostic result management information shown in FIG. 8 is stored in the diagnostic result management information storage unit 103. The diagnostic result management information includes: IDs for uniquely specifying records; score conditions (item name: CONDITION); and pieces of diagnostic result information (item name: DIAGNOSTIC RESULT).

Figure 9:
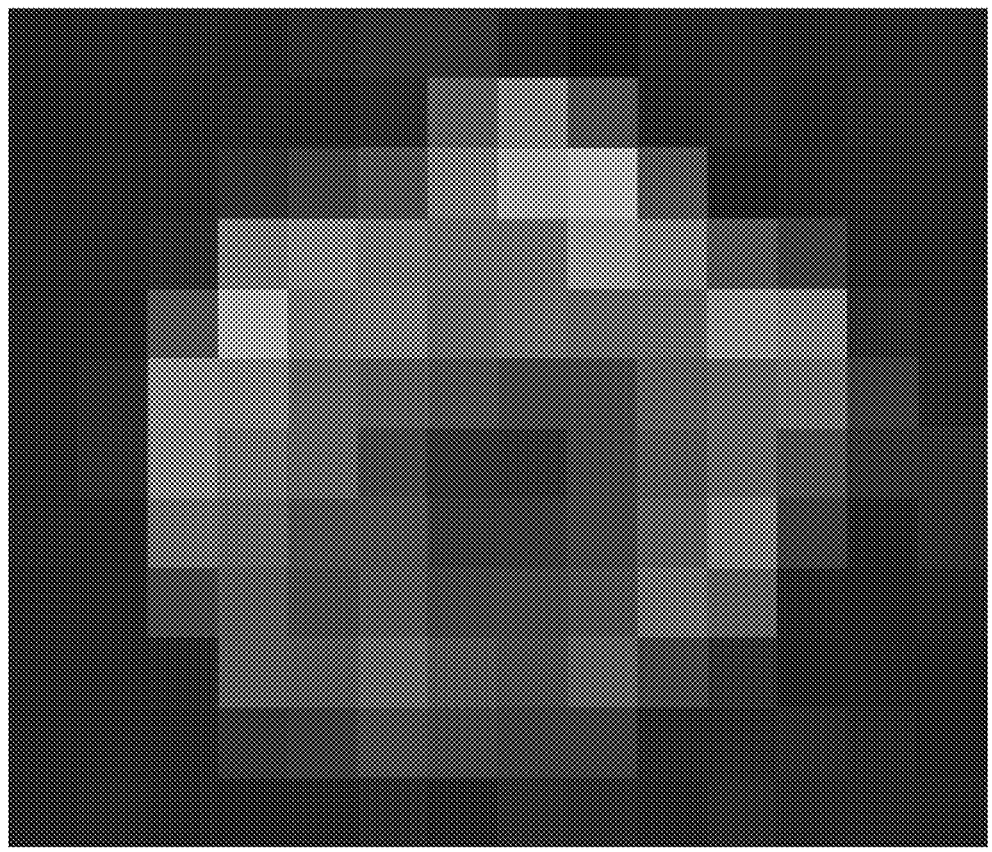
FIG. 9 is a diagram showing an example of a diffusion weighted image according to the same.

It is assumed that the receiving unit 104 receives one set of diffusion weighted images consisting of two or more diffusion weighted images that have different b-values. One diffusion weighted image out of the two or more diffusion weighted images is, for example, the image shown in FIG. 9.

Figure 10:
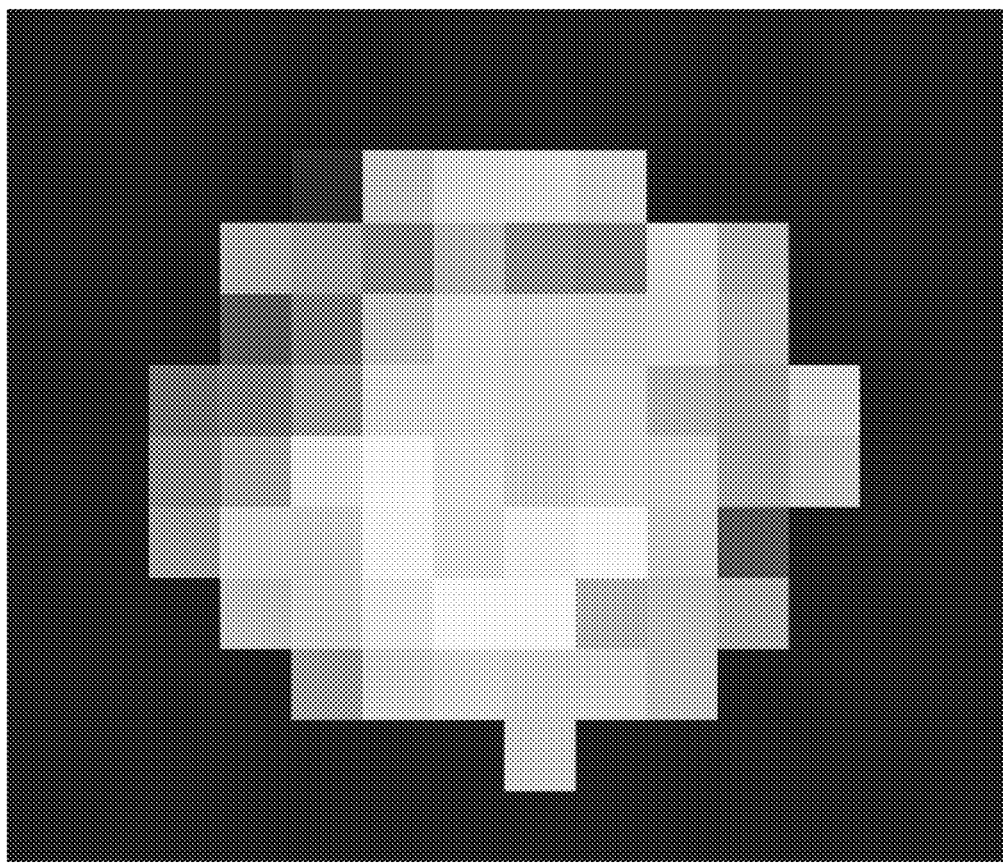
FIG. 10 is a diagram showing an example of an ADC image according to the same.
Figure 11:
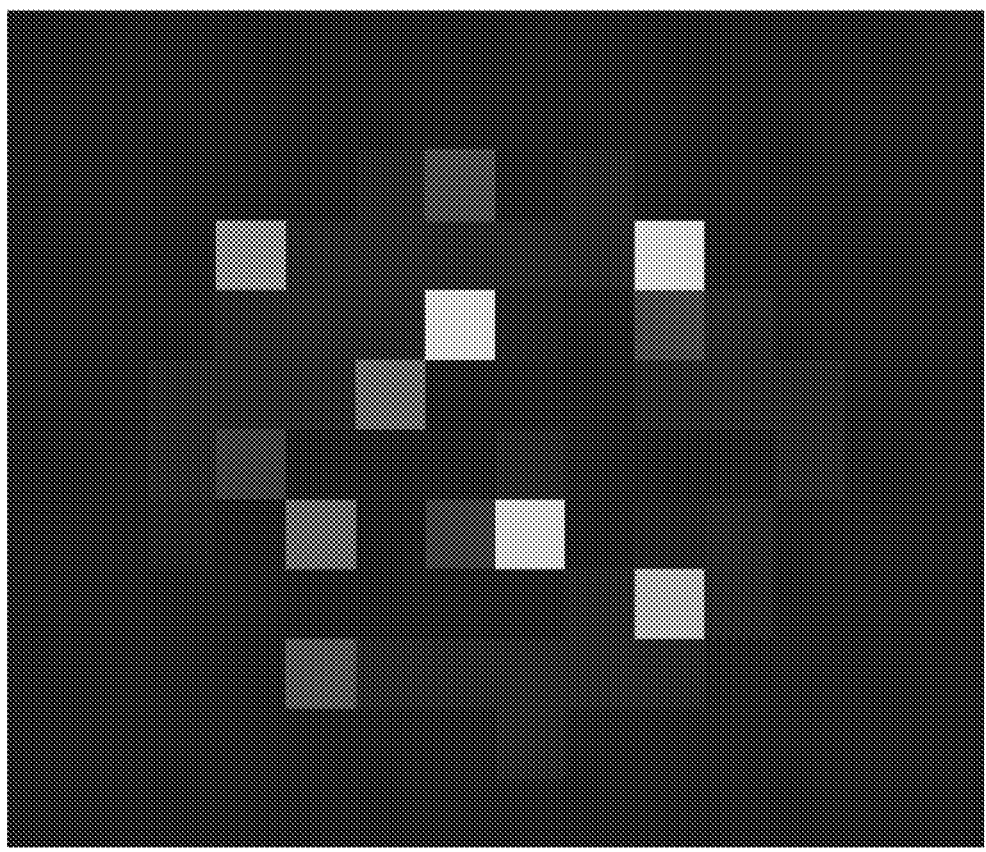
FIG. 11 is a diagram showing an example of an IVIM image according to the same.
Figure 12:
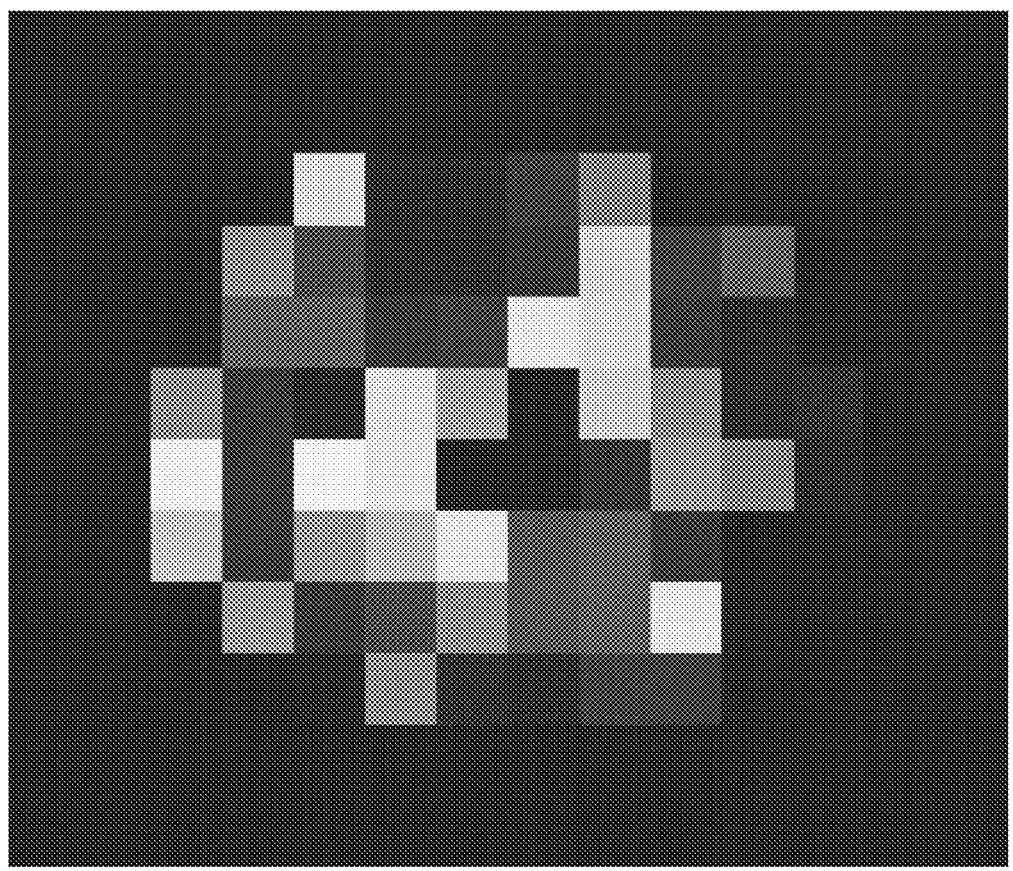
FIG. 12 is a diagram showing an example of a K image according to the same.

Next, using the one set of diffusion weighted images received by the receiving unit 104, the parameter acquisition unit 105 composes parameter images of two or more types. Here, it is assumed that the parameter acquisition unit 105 composes an ADC image, an IVIM image, and a K image. The ADC image is, for example, the image shown in FIG. 10. The IVIM image is the image shown in FIG. 11. The K image is, for example, the image shown in FIG. 12. These three parameter images are colored according to the values of the parameters corresponding to the pixels. Also, these three parameter images are each associated with type information. For example, it is assumed that the ADC image is associated with the type information "ADC". Also, for example, it is assumed that the IVIM image is associated with the type information "IVIM". Also, for example, it is assumed that the K image is associated with the type information "Kurtosis".

Next, the score acquisition information acquisition unit 106 acquires, for each of the above-described three parameter images, one or more parameter conditions that correspond to the parameter image. For example, the above-described ADC image is associated with the type information "ADC". Therefore, the score acquisition information acquisition unit 106 judges that the type information is the same as the type information "ADC" corresponding to "ID=011" and "ID=012" shown in FIG. 7. The score acquisition information acquisition unit 106 then acquires the parameter conditions "ADC<1.40×10^−3" and "ADC≥1.40×10^−3" corresponding to "ID=011" and "ID=012" shown in FIG. 7, together with the scores corresponding to the parameter conditions. Note that "10^−3" in the parameter conditions means 10 to the negative $3^{rd}$ power.

The score acquisition information acquisition unit 106 also acquires one or more parameter conditions for the above-described IVIM image and the above-described K image in the same manner as described above. For the IVIM image, the score acquisition information acquisition unit 106 acquires the parameter conditions "IVIM>2.07" and "IVIM≤2.07" corresponding to "ID=013" and "ID=014" shown in FIG. 7, together with the scores corresponding to the parameter conditions. For the K image, the score acquisition information acquisition unit 106 acquires the parameter conditions "K>0.8" and "K≤0.8" corresponding to "ID=015" and "ID=016" shown in FIG. 7, together with the scores corresponding to the parameter conditions.

Next, the score acquisition unit 107 acquires, for each of the three parameter images, one or more scores corresponding to the parameter image, using the parameter conditions acquired by the score acquisition information acquisition unit 106. For example, for the above-described ADC image, the score acquisition information acquisition unit 106 has acquired two parameter conditions "ADC<1.40×10^−3" and "ADC≥1.40×10^−3". Therefore, the score acquisition unit 107 judges, for each of one or more pixels that the ADC image has, which parameter condition out of the two parameter conditions is satisfied by the parameter (ADC value) corresponding to the pixel. For example, if the parameter corresponding to the pixel at coordinates (x,y)=(1,1) is "1.25×10^−3", the score acquisition unit 107 judges that the parameter satisfies the parameter condition "ADC<1.40×10^−3". The score acquisition unit 107 then acquires the score corresponding to the parameter condition that is satisfied by the parameter, as the score corresponding to the pixel. The results of acquisition of the scores are, for example, as shown in FIG. 13. In FIG. 13, one cell corresponds to one pixel. That is to say, in FIG. 13, the value in one cell is the score corresponding to the pixel corresponding to the cell.

The score acquisition unit 107 also acquires one or more scores for the above-described IVIM image and the above-described K image in the same manner as described above. For the IVIM image, the score acquisition unit 107 acquires the scores shown in FIG. 14, for example. For the K image, the score acquisition unit 107 acquires the scores shown in FIG. 15, for example.

Next, the diagnostic image composition unit 109 totals the scores shown in FIGS. 13 to 15 for each pixel at each position, and thus calculates totalled scores. The totalled scores thus obtained are, for example, as shown in FIG. 16.

Figure 16:
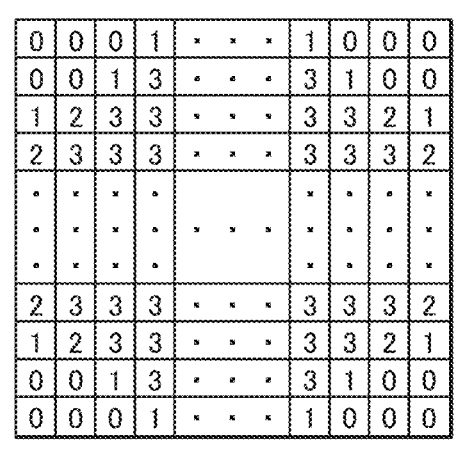

Next, using the totalled scores shown in FIG. 16, the diagnostic image composition unit 109 composes a diagnostic image by generating an image from the scores. Here, for example, the diagnostic image composition unit 109 holds a table showing the correspondence between: conditions regarding scores; and pixel values, in advance. Then, the diagnostic image composition unit 109 acquires one or more pixel values respectively corresponding to the one or more scores from the correspondence table. Then, the diagnostic image composition unit 109 composes a diagnostic image that is composed of one or more pixels having the one or more pixel values thus acquired. The diagnostic image is, for example, the image shown in FIG. 17. The one or more pixels that the diagnostic image has are, for example, respectively associated with the one or more scores shown in FIG. 16.

Next, the diagnostic result information acquisition unit 110 acquires one or more pieces of diagnostic result information that correspond to the diagnostic image. For example, in the diagnostic image shown in FIG. 17, regarding the regions that correspond to the score "3" in FIG. 16, the diagnostic result information acquisition unit 110 judges that the score "3" satisfies the score condition "score≥3" corresponding to "ID=011" in FIG. 8. The diagnostic result information acquisition unit 110 then acquires, as diagnostic result information corresponding to the regions, the diagnostic result information "MALIGNANT (STAGE 3)" corresponding to "ID=011" in FIG. 8. Similarly, the diagnostic result information acquisition unit 110 also acquires diagnostic result information for the other regions in FIG. 17.

Figure 17:
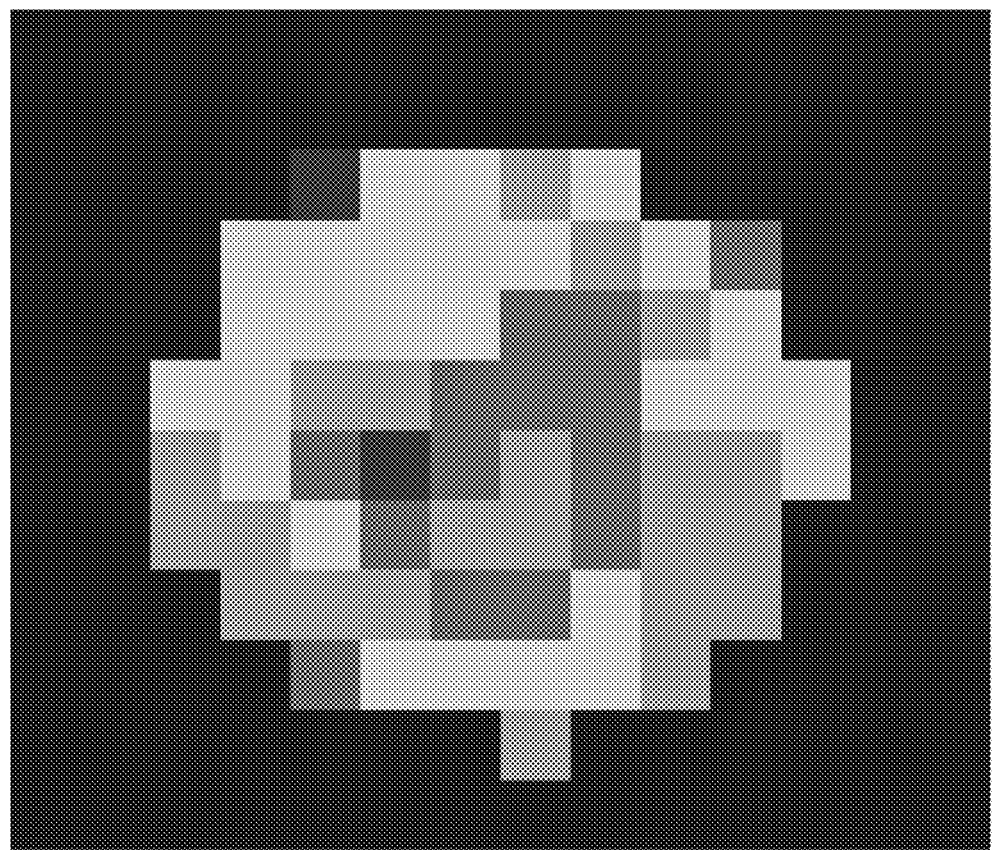
FIG. 17 is a diagram showing an example of a diagnostic image according to the same.
Figure 18:
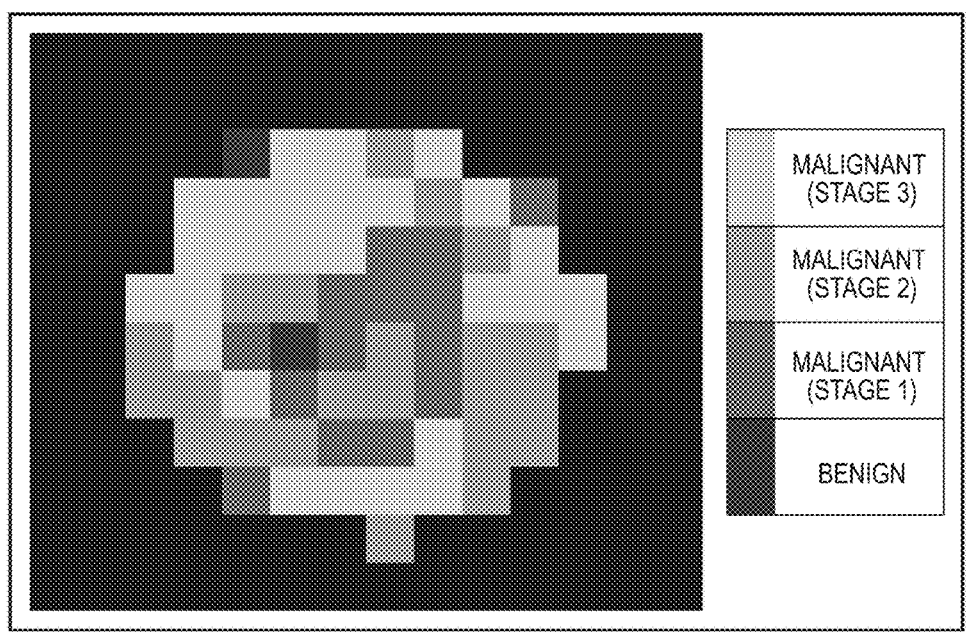
FIG. 18 is a diagram showing an example of an output of the diagnostic image and diagnostic result information according to the same.

Next, the output unit 111 outputs the diagnostic image shown in FIG. 17 and the one or more pieces of diagnostic result information acquired by the diagnostic result information acquisition unit 110. This situation is, for example, as shown in FIG. 18. As shown in FIG. 18, the output unit 111 outputs the diagnostic image and a table showing the correspondence between the colors in the diagnostic image and the pieces of diagnostic result information.

For example, it is assumed that the score coefficient management information shown in FIG. 19 is stored in the score coefficient management information storage unit 102. The score coefficient management information includes: IDs for uniquely specifying records; pieces of type information (item name: TYPE); and score coefficients.

If the score coefficient management information is stored in the score coefficient management information storage unit 102, the score coefficient acquisition unit 108 acquires score coefficients respectively corresponding to the three parameter images. For example, the above-described ADC image is associated with the type information "ADC". Therefore, the score coefficient acquisition unit 108 judges that the type information is the same as the type information "ADC" corresponding to "ID=011" shown in FIG. 19. The score coefficient acquisition unit 108 then acquires the score coefficient "1.5" corresponding to "ID=011" shown in FIG. 19.

The score coefficient acquisition unit 108 also acquires the score coefficients for the above-described IVIM image and the above-described K image in the same manner as described above. For the IVIM image, the score coefficient acquisition unit 108 acquires the score coefficient "1.0" corresponding to "ID=012" shown in FIG. 19. For the K image, the score coefficient acquisition unit 108 acquires the score coefficient "0.8" corresponding to "ID=013" shown in FIG. 19.

Next, the diagnostic image composition unit 109 multiplies the one or more scores corresponding to the parameter images of the respective types acquired by the score acquisition unit 107, by the score coefficients acquired by the score coefficient acquisition unit 108, and totals the scores. That is to say the diagnostic image composition unit 109 multiplies the score of the ADC image by the score coefficient "1.5". The diagnostic image composition unit 109 multiplies the score of the IVIM image by the score coefficient "1.0". The diagnostic image composition unit 109 multiplies the score of the K image by the score coefficient "0.8".

For example, it is assumed that the coordinates of the pixel that is to be processed is "(x,y)=(4,4)". If this is the case, the diagnostic image composition unit 109 multiplies the score "1" of the coordinates "(x,y)=(4,4)" in FIG. 13 by the score coefficient "1.5", and thus obtains "1.5". Also, the diagnostic image composition unit 109 multiplies the score "1" of the coordinates "(x,y)=(4,4)" in FIG. 14 by the score coefficient "1.0", and thus obtains "1.0". Also, the diagnostic image composition unit 109 multiplies the score "1" of the coordinates "(x,y)=(4,4)" in FIG. 15 by the score coefficient "0.8", and thus obtains "0.8". The diagnostic image composition unit 109 then totals the values "1.5", "1.0", and "0.8" obtained by the multiplication by the coefficients, and thus obtains the totalled score "3.3". The totalled scores thus obtained are, for example, as shown in FIG. 20.

An example of the score acquisition management information that has three parameter conditions each having two thresholds for the same type information is, for example, as shown in FIG. 21.

As described above, the image processing apparatus 1 according to the present embodiment is able to output an image that allows for an easy and accurate diagnosis as to whether or not a malignant tumor is present and that allows for correctly indicating a part with a high or low grade of malignancy in the tumor.

The image processing apparatus 1 according to the present embodiment is epoch-making and novel in that it is possible to so accurately create a detailed diagnostic map of a tumor lesion that it is possible to determine the course of treatment in short time, without using a contrast agent. It is possible to evaluate the entirety of the lesion using the image processing apparatus 1 according to the present embodiment. This can be extremely advantageous compared to biopsy by which only a portion of the lesion can be collected and the subject that can be evaluated is limited to the portion of the lesion. Meanwhile, with the image processing apparatus 1 according to the present embodiment, during biopsy, it is possible to display and highlight the portion of a tumor that is the most active (malignant) using the diagnostic map so that a needle can be safely and reliably guided to the position where the needle is to be inserted. Furthermore, with the image processing apparatus 1 according to the present embodiment, it is possible to avoid underestimation in diagnosis due to not performing a biopsy on the most malignant site. As described above, it is expected that patients and health professionals who work to cure a malignant tumor will be provided with significant benefits.

Figure 22:
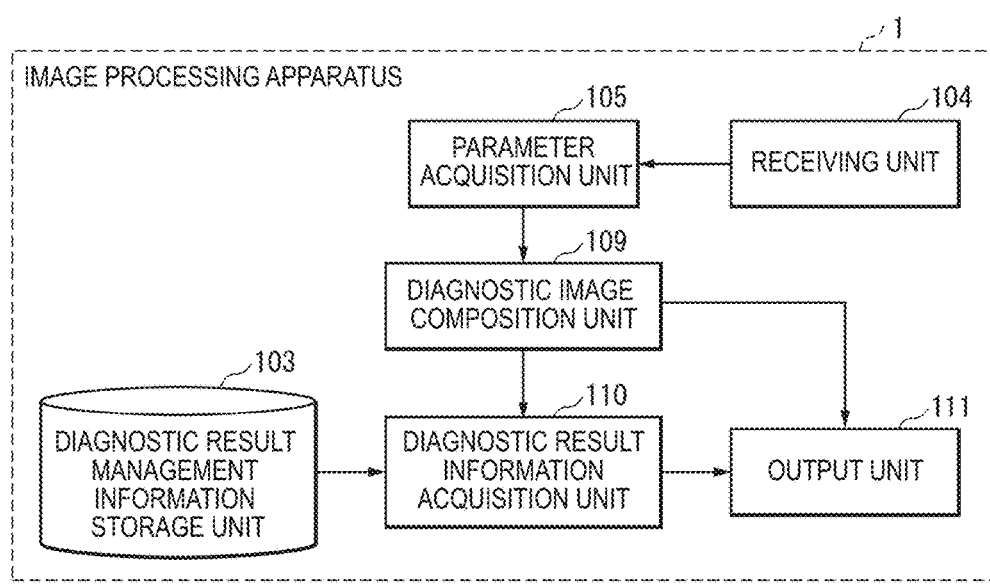
FIG. 22 is a block diagram for the image processing apparatus 1 according to the same.

Note that in the present embodiment, it is possible that the image processing apparatus 1 does not include the score acquisition management information storage unit 101, the score coefficient management information storage unit 102, the score acquisition information acquisition unit 106, the score acquisition unit 107, or the score coefficient acquisition unit 108, for example. FIG. 22 is a block diagram showing the image processing apparatus 1 in this case. If this is the case, using the diffusion weighted images received by the receiving unit 104, the parameter acquisition unit 105 acquires parameters of two or more types for one or more units of processing that constitute the diffusion weighted images. Then, using the parameters of two or more types acquired by the parameter acquisition unit 105, the diagnostic image composition unit 109 acquires, for each of the one or more units of processing, scores corresponding to the parameters of two or more types. The diagnostic image composition unit 109 then composes a diagnostic image that is an image having, for each of the one or more units of processing, a pixel value that corresponds to the acquired scores for the unit of processing. The diagnostic result information acquisition unit 110 then acquires one or more pieces of diagnostic result information that correspond to the score conditions satisfied by the scores that the diagnostic image composed by the diagnostic image composition unit 109 has. Then, the output unit 111 outputs the diagnostic image composed by the diagnostic image composition unit 109 and the one or more pieces of diagnostic result information acquired by the diagnostic result information acquisition unit 110.

Figure 23:
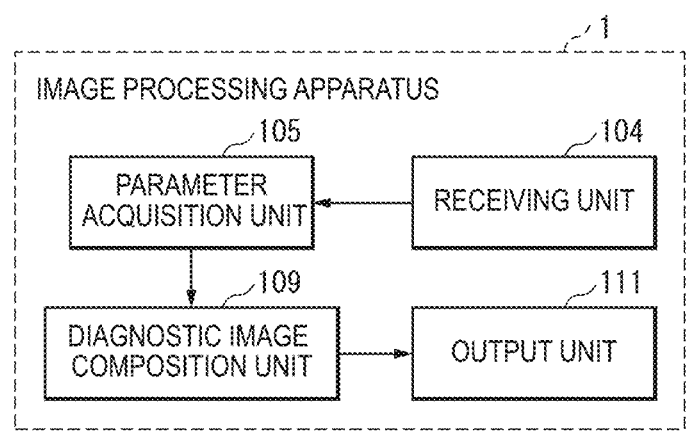
FIG. 23 is a block diagram for the image processing apparatus 1 according to the same.

Furthermore, in the present embodiment, it is possible that the image processing apparatus 1 does not include the diagnostic result management information storage unit 103 or the diagnostic result information acquisition unit 110 as well. FIG. 23 is a block diagram showing the image processing apparatus 1 in this case. If this is the case, using the diffusion weighted image received by the receiving unit 104, the parameter acquisition unit 105 acquires parameters of two or more types for one or more units of processing that constitute the diffusion weighted image. Then, using the parameters of two or more types acquired by the parameter acquisition unit 105, the diagnostic image composition unit 109 acquires, for each of the one or more units of processing, scores corresponding to the parameters of two or more types. The diagnostic image composition unit 109 then composes a diagnostic image that is an image having, for each of the one or more units of processing, a pixel value that corresponds to the acquired scores for the unit of processing. Then, the output unit 111 outputs the diagnostic image composed by the diagnostic image composition unit 109.

Figure 24:
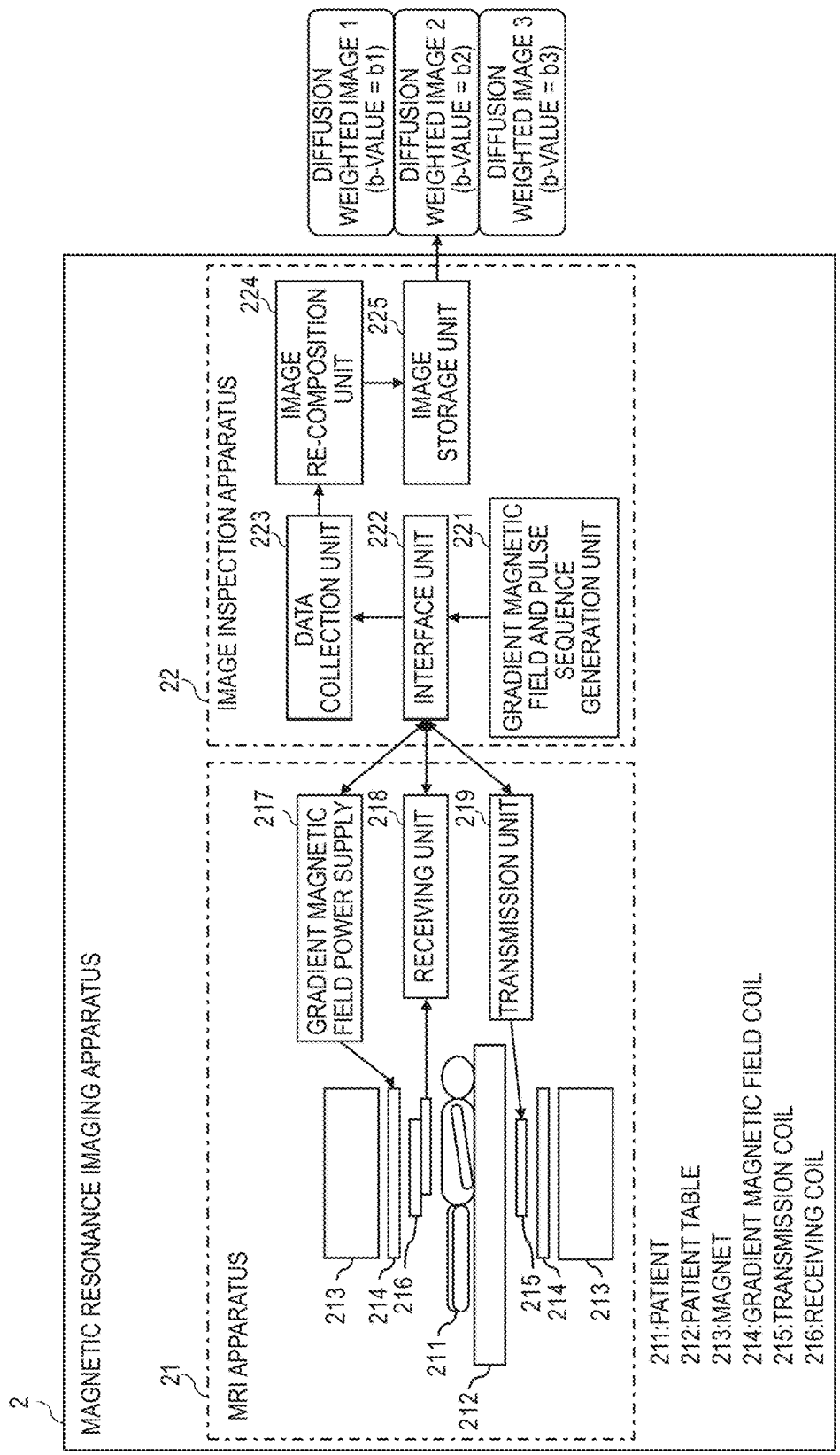
FIG. 24 is a block diagram for a magnetic resonance imaging apparatus 2 according to the same.

Also, in the present embodiment, the diffusion weighted image received by the receiving unit 104 is usually acquired or composed by a magnetic resonance imaging apparatus 2. In other words, the receiving unit 104 usually receives the diffusion weighted image that has been acquired or composed by the magnetic resonance imaging apparatus 2. FIG. 24 is an example of a conceptual diagram of the magnetic resonance imaging apparatus 2. In FIG. 24, the magnetic resonance imaging apparatus 2 includes an MRI apparatus 21 and an image inspection apparatus 22. The MRI apparatus 21 includes a patient table 212, a magnet 213, a gradient magnetic field coil 214, a high-frequency wave transmission coil 215, a high-frequency wave receiving coil 216, a gradient magnetic field power supply 217, a high-frequency receiving unit 218, and a high-frequency transmission unit 219. The image inspection apparatus 22 includes a gradient magnetic field and high-frequency pulse sequence generation unit 221, an interface unit 222, a data collection unit 223, an image re-composition unit 224, and an image storage unit 225. Note that processing and operations performed by each unit of the MRI apparatus 21 and each unit of the image inspection apparatus 22 are well known, and therefore a detailed description thereof is omitted. The magnetic resonance imaging apparatus 2 usually acquires or composes one or more diffusion weighted images that have different b-values. For example, in FIG. 24, the magnetic resonance imaging apparatus 2 acquires or composes three diffusion weighted images (a diffusion weighted image 1, a diffusion weighted image 2, and a diffusion weighted image 3) that have different b-values.

Also, in the present embodiment, the image processing apparatus 1 may include the magnetic resonance imaging apparatus 2 shown in FIG. 24, for example. If this is the case, the receiving unit 104 receives the diffusion weighted image that has been acquired or composed by the magnetic resonance imaging apparatus 2.

Also, the magnetic resonance imaging apparatus 2 shown in FIG. 24 may include the image processing apparatus 1 according to the present embodiment, for example. If this is the case, the receiving unit 104 receives the diffusion weighted image that has been stored in a predetermined storage region by the image storage unit 225 that is included in the magnetic resonance imaging apparatus 2.

The image processing apparatus in the above-described embodiment may be, for example, either a stand-alone apparatus or a server apparatus in a server-client system.

In the above-described embodiment, each process or each function may be realized as centralized processing using a single apparatus or a single system, or may be realized as distributed processing using multiple apparatuses or multiple systems.

In the above-described embodiment, each constituent element may be configured using dedicated hardware. Constituent elements that can be realized using software may be realized by executing a program. For example, each constituent element may be realized by a program execution unit such as a CPU reading and executing a software program stored in a storage medium such as a hard disk or a semiconductor memory.

The software that realizes the information processing apparatus in the above-described embodiment may be the following sort of program, for example. Specifically, this program is a program for causing a computer to function as: a receiving unit configured to receive diffusion weighted images; a parameter acquisition unit configured to acquire parameters of two or more types, using the diffusion weighted images; a diagnostic image composition unit configured to acquire one or more scores that correspond to the parameters of two or more types by using the parameters of two or more types, and to compose a diagnostic image that is an image having the one or more acquired scores and that is an image generated from the one or more acquired scores; and an output unit that outputs the diagnostic image.

In the above-described program, the functions realized by the above-described program do not include functions that can be realized only by hardware.

Also, the above-described program may be downloaded from a server or the like and executed, or may be executed by reading the program stored in a predetermined storage medium (e.g. an optical disc such as a CD-ROM, a magnetic disk, a semiconductor memory, etc.). This program may be used as a program constituting a program product.

The above-described program may be executed by a single computer or multiple computers. That is to say, centralized processing or distributed processing may be performed.

Figure 25:
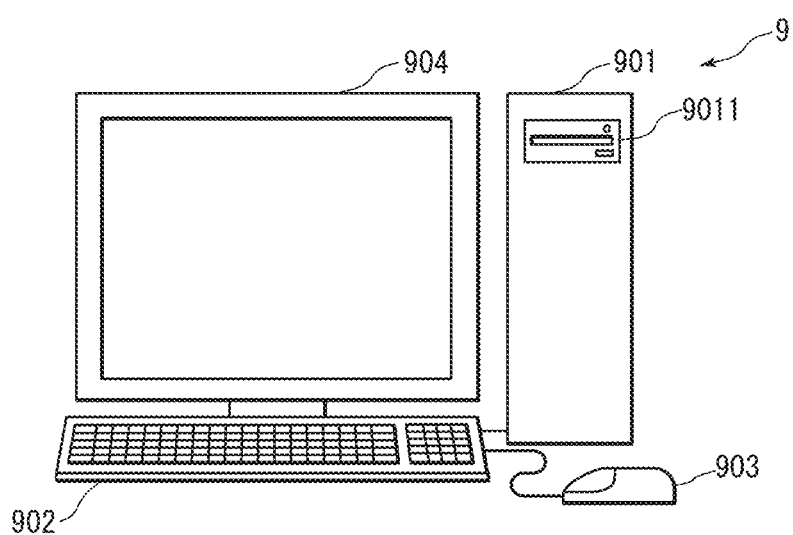
FIG. 25 is a schematic diagram for a computer system according to the aforementioned embodiment.

FIG. 25 is a schematic view showing a computer system 9 that executes the programs described above to realize the image processing apparatus and the like according to the above-described embodiment. The above-described embodiment may be realized using computer hardware and computer programs executed thereon.

In FIG. 25, the computer system 9 includes: a computer 901 that includes a CD-ROM drive 9011; a keyboard 902; a mouse 903; and a monitor 904.

Figure 26:
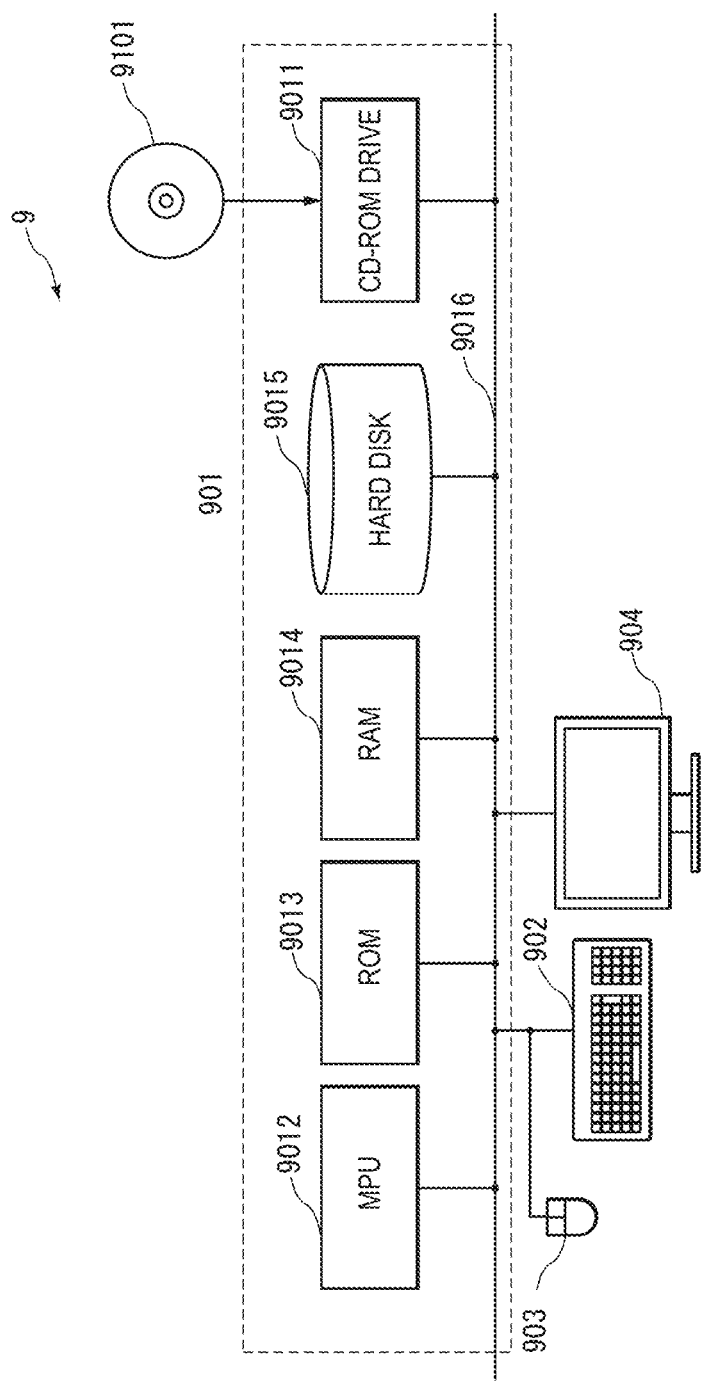
FIG. 26 is a block diagram for a computer system according to the aforementioned embodiment.

FIG. 26 is a block diagram for the computer system 9. In FIG. 26, the computer 901 includes, in addition to the CD-ROM drive 9011; an MPU 9012; a ROM 9013 in which a program such as a boot up program is to be stored; a RAM 9014 that is connected to the MPU 9012 and in which a command of an application program is temporarily stored, and provides a temporary storage space; a hard disk 9015 in which an application program, a system program, and data are stored; and a bus 9016 that connects the CD-ROM drive 9011, the MPU 9012, and the like. Although not shown, the computer 901 may further include a network card that provides connection to a LAN.

The program for causing the computer system 9 to execute the functions of the image processing apparatus and the like according to the above-described embodiment may be stored in a CD-ROM 9101 that is inserted into the CD-ROM drive 9011, and be transmitted to the hard disk 9015. Alternatively, the program may be transmitted via an unshown network to the computer 901 and stored in the hard disk 9015. At the time of execution, the program is loaded into the RAM 9014. The program may be loaded from the CD-ROM 9101 or directly from a network.

The program does not necessarily have to include, for example, an operating system (OS) or a third party program to cause the computer 901 to execute the functions of the image processing apparatus and the like according to the above-described embodiment. The program may only include a command portion to call an appropriate function (module) in a controlled mode and obtain desired results. The manner in which the computer system 9 operates is well known, and therefore a detailed description thereof is omitted.

The present invention is not limited to the above-described embodiment. Various modifications are possible, and needless to say, such modifications are included in the scope of the present invention.

INDUSTRIAL APPLICABILITY

As described above, the image processing apparatus according to one aspect of the present invention has an advantageous effect in that it is possible to output an image that allows for an easy and accurate diagnosis as to whether or not a malignant tumor is present and that allows for correctly indicating a part with a high or low grade of malignancy in the tumor. The image processing apparatus is useful as a nuclear magnetic resonance image diagnostic apparatus or the like.

LIST OF REFERENCE NUMERALS

1 Image processing apparatus
101 Score acquisition management information storage unit
102 Score coefficient management information storage unit
103 Diagnostic result management information storage unit
104 Receiving unit
105 Parameter acquisition unit
106 Score acquisition information acquisition unit
107 Score acquisition unit
108 Score coefficient acquisition unit
109 Diagnostic image composition unit 110 Diagnostic result information acquisition unit
111 Output unit

The invention claimed is:

1. An image processing apparatus comprising:
a score acquisition management information storage unit in which pieces of score acquisition management information are stored, wherein:
type information and score acquisition information are associated with each other in the score acquisition management information,
the type information indicates parameter types, and
the score acquisition information includes parameter conditions having thresholds for parameter values;
a receiving unit configured to receive diffusion weighted images, wherein the diffusion weighted images are constituted by units of processing;
a parameter acquisition unit configured to acquire, from the diffusion weighted images, parameter maps of the diffusion weighted images for the parameter types, respectively,
wherein each of the parameter maps of the diffusion weighted images includes a parameter value of a corresponding parameter type per each of the units of processing;
a score acquisition information acquisition unit configured to acquire, from the score acquisition management information storage unit, score acquisition information that corresponds to the parameter maps of the diffusion weighted images, respectively;
a score acquisition unit configured to acquire, from the acquired score acquisition information, for each of the units of processing, scores that correspond to the parameter maps, respectively, by using parameter values that the parameter maps have and the parameter conditions, wherein the score acquisition unit acquires the scores according to whether or not parameter values of the unit of processing satisfy the parameter conditions, respectively, for the parameter maps;
a diagnostic image composition unit configured to total, for each of the units of processing, the acquired scores of the parameter maps, to calculate a diagnostic score of each of the units of processing, and to compose a diagnostic image that is an image having, for each of the units of processing, a pixel value that corresponds to the diagnostic score of each of the units of processing; and
an output unit configured to output the diagnostic image.

2. The image processing apparatus according to claim 1, wherein:
the score acquisition information includes two parameter conditions for each of the parameter types associated with different scores,
and
the score acquisition unit is configured to acquire the scores based on which one of the two parameter conditions the parameter values satisfy.

3. The image processing apparatus according to claim 1, further comprising:
a score coefficient management information storage unit in which pieces of score coefficient management information are stored, the score coefficient management information being information in which the parameter types and score coefficients that are weights assigned to scores are associated with each other; and
a score coefficient acquisition unit configured to acquire, from the score coefficient management information, score coefficients that correspond to the parameter types, respectively,
wherein the diagnostic image composition unit is configured to multiply, for each of the units of processing, the scores acquired by the score acquisition unit, by the score coefficients acquired by the score coefficient acquisition unit for the parameter maps, respectively, to total the scores obtained by the multiplication, for each of the units of processing, to calculate the diagnostic score, for each of the units of processing, and to compose the diagnostic image that has, for each of the units of processing, the pixel value that corresponds to the diagnostic score for each of the units of processing thus calculated.

4. The image processing apparatus according to claim 1, wherein the diagnostic image composition unit is configured to compose the diagnostic image that has, for each of the units of processing, color indicating the pixel value that corresponds to the score of the unit of processing.

5. The image processing apparatus according to claim 1, wherein:
the receiving unit is configured to receive two-dimensional diffusion weighted images of different image-captured positions,
the parameter acquisition unit is configured to acquire two-dimensional parameter maps for each of the two-dimensional diffusion weighted images, and
the diagnostic image composition unit is configured to acquire the diagnostic score for each of the units of processing for the two-dimensional diffusion weighted images, to compose diagnostic images, each of which has, for each of the units of processing, the pixel value that corresponds to the diagnostic score thus acquired, and to compose a three-dimensional diagnostic image by compositing the diagnostic images thus composed.

6. The image processing apparatus according to claim 1, further comprising:
a diagnostic result management information storage unit in which diagnostic result management information is stored, wherein, in the diagnostic result management information, score conditions regarding the scores that the diagnostic image has and diagnostic result information that indicates diagnostic results that correspond to the scores are associated with each other; and
a diagnostic result information acquisition unit configured to acquire one or more pieces of the diagnostic result information that correspond to the score conditions satisfied by the diagnostic scores of the diagnostic image,
wherein the output unit outputs the diagnostic image, together with the one or more pieces of diagnostic result.

7. The image processing apparatus according to claim 1, wherein the parameter types are two or more selected from the group consisting of:
an ADC value that is calculated using the diffusion weighted images;
an IVIM that is calculated using the diffusion weighted images; and
a K value that is calculated using the diffusion weighted images.

8. The image processing apparatus according to claim 1, wherein each of the units of processing is one pixel of the diffusion weighted images.

9. A magnetic resonance imaging apparatus that is provided with the image processing apparatus according to claim 1.

10. An image processing method performed by using a receiving unit, a parameter acquisition unit, a score acquisition information acquisition unit, a score acquisition unit, a diagnostic image composition unit, and an output unit, wherein a storage medium is provided with a score acquisition management information storage unit in which pieces of score acquisition management information are stored, type information and score acquisition information are associated with each other in the score acquisition management information, the type information indicates parameter types, and the score acquisition information includes parameter conditions having thresholds for parameter values, the image processing method comprising:

a receiving step in which the receiving unit receives diffusion weighted images, wherein the diffusion weighted images are constituted by units of processing;

a parameter acquisition step in which the parameter acquisition unit acquires, from the diffusion weighted images, parameter maps of the diffusion weighted images for the parameter types, respectively, wherein each of the parameter maps of the diffusion weighted images includes a parameter value of a corresponding parameter type per each of the units of processing;

a score acquisition information acquisition step in which the score acquisition information acquisition unit acquires, from the score acquisition management information storage unit, score acquisition information that corresponds to the parameter maps of the diffusion weighted images, respectively;

a score acquisition step in which the score acquisition unit acquires, from the acquired score acquisition information, for each of the units of processing, scores that correspond to the parameter maps, respectively, by using parameter values that the parameter maps have and the parameter conditions, wherein the score acquisition unit acquires the scores according to whether or not parameter values of the unit of processing satisfy the parameter conditions, respectively, for the parameter maps;

a diagnostic image composition step in which the diagnostic image composition unit totals, for each of the units of processing, the acquired scores of the parameter maps, calculates a diagnostic score of each of the units of processing, and composes a diagnostic image that is an image having, for each of the units of processing, a pixel value that corresponds to the diagnostic score of each of the units of processing; and an output step in which the output unit outputs the diagnostic image.

11. A non-transitory storage medium, in which a program is stored, which is accessible by a computer, and which is provided with a score acquisition management information storage unit in which pieces of score acquisition management information are stored, wherein type information and score acquisition information are associated with each other in the score acquisition management information, the type information indicates parameter types, and the score acquisition information includes parameter conditions having thresholds for parameter values, the program causing a computer to function as:

a receiving unit configured to receive diffusion weighted images, wherein the diffusion weighted images are constituted by a plurality of units of processing;

a parameter acquisition unit configured to acquire, from the diffusion weighted images, parameter maps of the diffusion weighted images for the parameter types, respectively, wherein each of the parameter maps of the diffusion weighted images includes a parameter value of a corresponding parameter type per each of the units of processing;

a score acquisition information acquisition unit configured to acquire, from the score acquisition management information storage unit, score acquisition information that corresponds to the parameter maps of the diffusion weighted images, respectively;

a score acquisition unit configured to acquire, from the acquired score acquisition information, for each of the units of processing, scores that correspond to the parameter maps, respectively by using parameter values that the parameter maps have and the parameter conditions, wherein the score acquisition unit acquires the scores according to whether or not parameter values of the unit of processing satisfy the parameter conditions, respectively, for the parameter maps;

a diagnostic image composition unit configured to total, for each of the units of processing, the acquired scores of the parameter maps, to calculate a diagnostic score of each of the units of processing, and to compose a diagnostic image that is an image having, for each of the units of processing, a pixel value that corresponds to the diagnostic score of each of the units of processing; and an output unit configured to output the diagnostic image.

* * * * *